(12) United States Patent
Kong et al.

(10) Patent No.: US 12,289,975 B2
(45) Date of Patent: Apr. 29, 2025

(54) DISPLAY DEVICE

(71) Applicant: SAMSUNG DISPLAY CO., LTD., Yongin-si (KR)

(72) Inventors: Tae Jin Kong, Yongin-si (KR); Hyun Min Cho, Yongin-si (KR); Dae Hyun Kim, Yongin-si (KR); Su Mi Moon, Yongin-si (KR); Xinxing Li, Yongin-si (KR); Hee Keun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 540 days.

(21) Appl. No.: 17/624,673

(22) PCT Filed: Jun. 26, 2020

(86) PCT No.: PCT/KR2020/008410
§ 371 (c)(1),
(2) Date: Jan. 4, 2022

(87) PCT Pub. No.: WO2021/006509
PCT Pub. Date: Jan. 14, 2021

(65) Prior Publication Data
US 2022/0278173 A1 Sep. 1, 2022

(30) Foreign Application Priority Data
Jul. 5, 2019 (KR) .......... 10-2019-0081533

(51) Int. Cl.
*H01L 27/32* (2006.01)
*H10K 50/854* (2023.01)
(Continued)

(52) U.S. Cl.
CPC .......... *H10K 59/38* (2023.02); *H10K 50/854* (2023.02); *H10K 59/122* (2023.02);
(Continued)

(58) Field of Classification Search
CPC .... H10K 59/38; H10K 50/854; H10K 59/122; H10K 59/351
See application file for complete search history.

(56) References Cited

U.S. PATENT DOCUMENTS 8,987,765 B2   3/2015   Bibl et al.
9,178,123 B2   11/2015  Sakariya et al.
(Continued)

FOREIGN PATENT DOCUMENTS

KR   10-2014-0127136   11/2014
KR   10-2015-0129551   11/2015
(Continued)

OTHER PUBLICATIONS

International Search Report, with English translation, corresponding to International Application No. PCT/KR2020/008410 dated Oct. 12, 2020.
(Continued)

*Primary Examiner* — Jarrett J Stark
(74) *Attorney, Agent, or Firm* — KILE PARK REED & HOUTTEMAN PLLC

(57) ABSTRACT

A display device may include a first sub-pixel including a first light emitting element disposed in a first sub-pixel area of a substrate, a second sub-pixel including a second light emitting element disposed in a second sub-pixel area located in a first direction with respect to the first sub-pixel area of the substrate, a bank layer disposed between the first and second sub-pixels, a first color filter pattern disposed on the first sub-pixel and the bank layer, and a second color filter pattern disposed on the second sub-pixel and the bank layer. The first light emitting element may emit light having a first color. The second light emitting element may emit light
(Continued)

having a second color. The first color filter pattern and the second color filter pattern may at least partially overlap each other on the bank layer.

21 Claims, 17 Drawing Sheets

(51) Int. Cl.
*H10K 59/122* (2023.01)
*H10K 59/35* (2023.01)
*H10K 59/38* (2023.01)
*H10K 102/10* (2023.01)

(52) U.S. Cl.
CPC ..... *H10K 59/351* (2023.02); *H10K 2102/102* (2023.02); *H10K 2102/103* (2023.02)

(56) References Cited

U.S. PATENT DOCUMENTS

| | | | |
|---|---|---|---|
| 9,431,463 | B2 | 8/2016 | Choi |
| 9,887,246 | B2 | 2/2018 | Kim et al. |
| 10,181,500 | B2 | 1/2019 | Kim |
| 10,373,985 | B2 | 8/2019 | Kim et al. |
| 10,461,123 | B2 | 10/2019 | Kim et al. |
| 10,672,946 | B2 | 6/2020 | Cho et al. |
| 10,797,212 | B2 | 10/2020 | Im et al. |
| 2010/0289993 | A1* | 11/2010 | Matsuyama ........... G02B 5/201 347/40 |
| 2017/0186823 | A1* | 6/2017 | Kim .................. H10K 59/8792 |
| 2017/0358624 | A1* | 12/2017 | Takeya ................... H01L 33/42 |
| 2018/0019369 | A1 | 1/2018 | Cho et al. |
| 2018/0047876 | A1 | 2/2018 | Chu et al. |
| 2018/0061894 | A1* | 3/2018 | Kim ..................... H10K 50/865 |
| 2020/0013766 | A1* | 1/2020 | Kim ..................... H01L 25/167 |
| 2021/0408104 | A1* | 12/2021 | Lee ..................... H01L 25/0753 |
| 2022/0158043 | A1* | 5/2022 | Lee ....................... H01L 33/502 |
| 2022/0278173 | A1* | 9/2022 | Kong .................. H10K 59/351 |
| 2022/0336510 | A1* | 10/2022 | Hai ................... H01L 27/14603 |
| 2023/0030535 | A1* | 2/2023 | Lee ......................... H01L 33/44 |
| 2023/0261152 | A1* | 8/2023 | Tak ......................... H01L 33/58 257/79 |
| 2024/0032410 | A1* | 1/2024 | Chen ....................... B32B 27/36 |

FOREIGN PATENT DOCUMENTS

| | | |
|---|---|---|
| KR | 10-2017-0077887 | 7/2017 |
| KR | 10-2017-0117282 | 10/2017 |
| KR | 10-2018-0007376 | 1/2018 |
| KR | 10-2018-0025081 | 3/2018 |
| KR | 10-2018-0072909 | 7/2018 |
| KR | 10-2018-0132386 | 12/2018 |
| KR | 10-2019-0042130 | 4/2019 |
| KR | 10-2019-0124359 | 11/2019 |

OTHER PUBLICATIONS

Written Opinion, with English translation, corresponding to International Application No. PCT/KR2020/008410, dated Oct. 12, 2020.

* cited by examiner

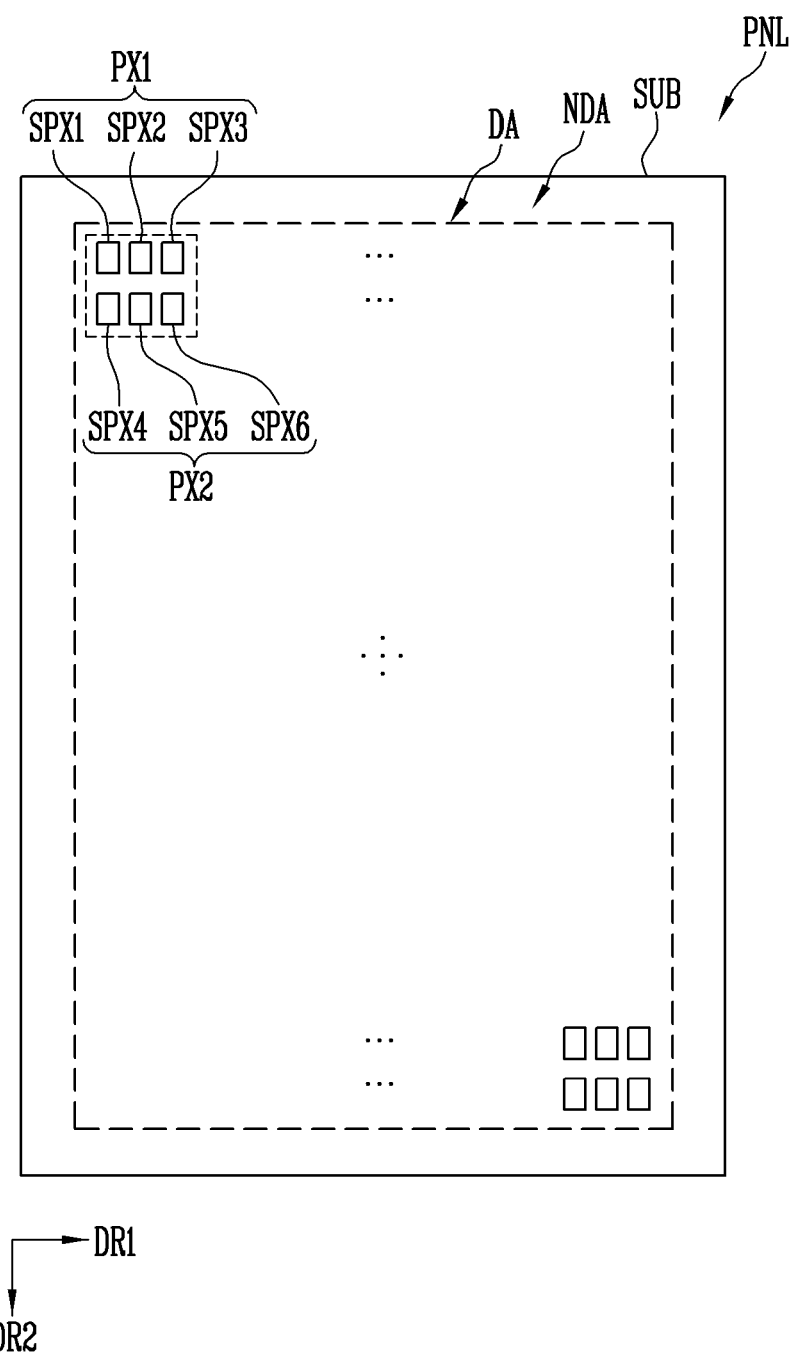

DISPLAY DEVICE

CROSS-REFERENCE TO RELATED APPLICATION(S)

This application is a national entry of International Application No. PCT/KR2020/008410, filed on Jun. 26, 2020, which claims under 35 U.S.C. §§ 119(a) and 365(b) priority to and benefits of Korean Patent Application No. 10-2019-0081533, filed on Jul. 5, 2019, in the Korean Intellectual Property Office (KIPO), the entire contents of which are incorporated herein by reference.

BACKGROUND

1. Technical Field

Various embodiments of the disclosure relate to a display device, and more particularly, to a display device including a light emitting element.

2. Description of the Related Art

With an increase in interest in an information display and an increase in demand to use portable information media, demand for display devices is markedly increased, and commercialization thereof is in progress.

SUMMARY

An object of the disclosure is to provide a display device which may minimize reflectivity of external light and enhance color reproducibility, thus improving image characteristics.

The objects of the disclosure are not limited to the above-stated object, and those skilled in the art will clearly understand other not mentioned objects from the accompanying claims.

A display device in accordance with an embodiment of the disclosure includes a first sub-pixel including a first light emitting element disposed in a first sub-pixel area of a substrate; a second sub-pixel including a second light emitting element disposed in a second sub-pixel area located in a first direction with respect to the first sub-pixel area of the substrate; a bank layer disposed between the first sub-pixel and the second sub-pixel; a first color filter pattern disposed on the first sub-pixel and the bank layer; and a second color filter pattern disposed on the second sub-pixel and the bank layer. The first light emitting element emits light having a first color. The second light emitting element emits light having a second color different from the first color. The first color filter pattern and the second color filter pattern at least partially overlap each other on the bank layer.

The display device may further include a third sub-pixel including a third light emitting element disposed in a third sub-pixel area adjacent to the second sub-pixel area, the bank layer disposed between the second sub-pixel and the third sub-pixel, and a third color filter pattern disposed on the third sub-pixel and the bank layer. The third light emitting element may emit light having a third color different from the first color and the second color. The third color filter pattern may be a color filter different from the first color filter pattern and the second color filter pattern. The second color filter pattern and the third color filter pattern may at least partially overlap each other on the bank layer.

The third color filter pattern may be further disposed on the bank layer disposed between the first sub-pixel and the second sub-pixel.

The first color filter pattern may be further disposed on the bank layer disposed between the second sub-pixel and the third sub-pixel.

The second color filter pattern may be further disposed on the bank layer disposed between the third sub-pixel and the first sub-pixel.

In a plan view, a fourth sub-pixel area may be located in a second direction perpendicular to the first direction with respect to the first sub-pixel area. The display device may further include a fourth sub-pixel including a fourth light emitting element disposed in the fourth sub-pixel area, the bank layer disposed between the first sub-pixel and the fourth sub-pixel, and a fourth color filter pattern disposed on the fourth sub-pixel and the bank layer. The fourth light emitting element may emit light having one of the first color, the second color, and the third color. The fourth color filter pattern may be a color filter substantially identical to one of the first color filter pattern, the second color filter pattern, and the third color filter pattern.

The fourth light emitting element may emit light having a color substantially identical to the first color of the first light emitting element, and the fourth color filter pattern may be a color filter substantially identical to the first color filter pattern. The first color filter pattern and the fourth color filter pattern may be provided as a single color filter and successively disposed in the first sub-pixel area and the fourth sub-pixel area.

At least one of the second color filter pattern and the third color filter pattern may be further disposed on the bank layer disposed between the first sub-pixel and the fourth sub-pixel.

The fourth light emitting element may emit light having a color substantially identical to one of the second color of the second light emitting element and the third color of the third light emitting element. The fourth color filter pattern may be a color filter substantially identical to any one of the second color filter pattern and the third color filter pattern.

The first color filter pattern, the second color filter pattern, and the third color filter pattern may be disposed on the bank layer disposed between the first sub-pixel and the fourth sub-pixel.

The first color filter pattern, the second color filter pattern, and the third color filter pattern may further include scattering particles dispersed therein.

The scattering particles may include at least one of titanium oxide ($TiO_2$), zirconium oxide ($ZrO_2$), aluminium oxide ($Al_2O_3$), indium oxide ($In_2O_3$), zinc oxide (ZnO), tin oxide ($SnO_2$), and silica.

The first color may be red, the second color may be green, and the third color may be blue.

A height of each of the first color filter pattern and the second color filter pattern may be greater than a height of the bank layer.

The display device may further include a capping layer disposed to overlap the first color filter pattern and the second color filter pattern.

Each of the first light emitting element and the second light emitting element may be a light emitting diode having a size of a micrometer scale or a nanometer scale. Each of the first light emitting element and the second light emitting element may include a first semiconductor layer doped with a first conductive dopant, a second semiconductor layer doped with a second conductive dopant, and an active layer disposed between the first semiconductor layer and the second semiconductor layer.

The first semiconductor layer may be disposed on a first end of each of the first light emitting element and the second light emitting element, and the second semiconductor layer may be disposed on a second end of each of the first light emitting element and the second light emitting element. The first semiconductor layer may include an n-type semiconductor layer, the second semiconductor layer may include a p-type semiconductor layer, and a length of the first semiconductor layer may be greater than a length of the second semiconductor layer.

The display device may further include a first electrode and a second electrode disposed on the substrate and spaced apart from each other in the first direction. The first electrode may be electrically connected to the first end, and the second electrode may be electrically connected to the second end.

A first bank formed adjacent to the first end of the first light emitting element and a second bank formed adjacent to the second end of the first light emitting element may be included in the first sub-pixel area. The first bank may be disposed between the substrate and the first electrode, and the second bank may be disposed between the substrate and the second electrode.

The display device may further include a passivation layer disposed on the substrate and overlapping the first light emitting element, the first electrode, and the second electrode. The bank layer may be disposed on the passivation layer.

Details of various embodiments are included in the detailed descriptions and drawings.

Embodiments of the disclosure are to provide a display device which may minimize reflectivity of external light and enhance color reproducibility, thus improving image characteristics.

The effects of the disclosure are not limited by the foregoing, and other various effects are anticipated herein.

BRIEF DESCRIPTION OF DRAWINGS

An additional appreciation according to the embodiments of the disclosure will become more apparent by describing in detail the embodiments thereof with reference to the accompanying drawings, wherein:

FIG. 2 is a plan view schematically illustrating a display device in accordance with an embodiment.

DETAILED DESCRIPTION OF THE EMBODIMENTS

Figure 1A:
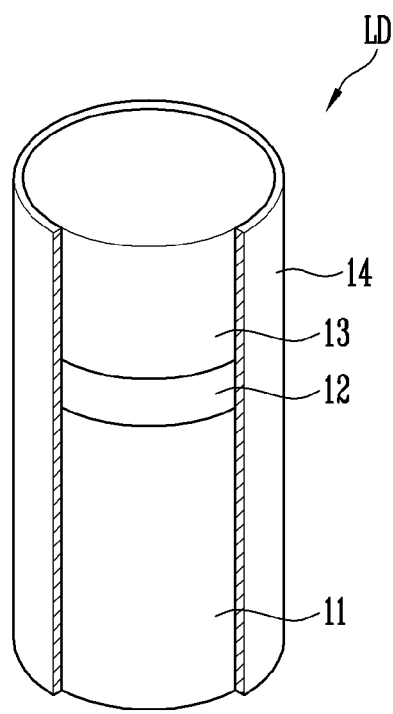
FIGS. 1A and 1B are perspective views each schematically illustrating a light emitting element in accordance with an embodiment.

Advantages and features of the disclosure, and methods for achieving the same will be described with reference to embodiments below in detail together with the accompanying drawings. The disclosure may, however, be embodied in many different forms and should not be construed as being limited to the embodiments set forth herein. Rather, these embodiments are provided so that this disclosure will be thorough and complete and will convey the concept of the disclosure to those skilled in the art, and the disclosure will only be defined by the appended claims.

It will be understood that in case that an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. In the disclosure, the singular forms are intended to include the plural meanings as well, unless the context clearly indicates otherwise.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 1B:
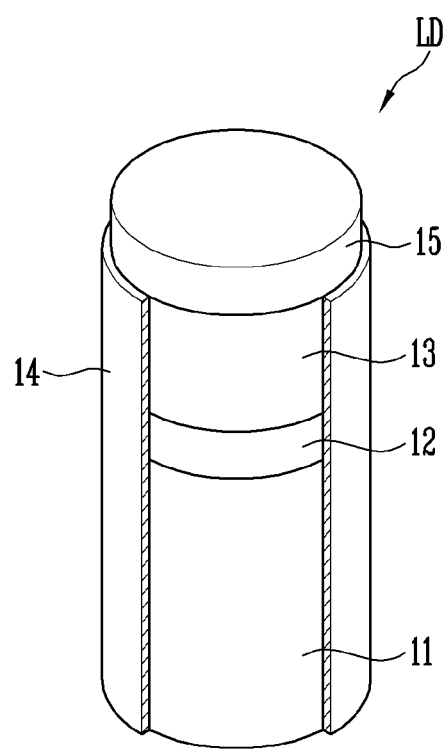

FIGS. 1A and 1B are schematic perspective views each illustrating a light emitting element in accordance with an embodiment.

Although FIG. 1A illustrates that a light emitting element LD is a cylindrical rod-type light emitting element, the disclosure is not limited thereto. For example, the light emitting element LD may be a light emitting element having a core-shell structure.

Referring to FIG. 1A, the light emitting element LD in accordance with an embodiment may include a first semiconductor layer 11, a second semiconductor layer 13, and an active layer 12 interposed between the first and second semiconductor layers 11 and 13.

For example, the rod-type light emitting element LD may be implemented as a stack formed by successively stacking the first semiconductor layer 11, the active layer 12, and the second semiconductor layer 13 each other.

In an embodiment, the light emitting element LD may be provided in the form of a rod extending in a direction. If the direction in which the light emitting element LD extends is defined as a longitudinal direction, the light emitting element LD may have a first end and a second end in the longitudinal direction.

In an embodiment, one of the first and second semiconductor layers 11 and 13 may be disposed on the first end, and the other of the first and second semiconductor layers 11 and 13 may be disposed on the second end.

In an embodiment, the light emitting element LD may have a rod-type shape. Here, the term "rod type" refers to a rod-like shape and a bar-like shape such as a cylindrical shape and a prismatic shape extending in the longitudinal direction (i.e., to have an aspect ratio greater than 1). For example, the length of the light emitting element LD may be greater than the diameter thereof.

The light emitting element LD may be fabricated in a small size having a diameter and/or length corresponding to, e.g., a micro-scale or nano-scale size.

However, the size of the light emitting element LD in accordance with an embodiment is not limited thereto, and the size of the light emitting element LD may be changed to satisfy requirements for a display device for which the light emitting element LD is used.

The first semiconductor layer 11 may include, for example, at least one n-type semiconductor layer. For instance, the first semiconductor layer 11 may include a semiconductor layer which includes a semiconductor material of InAlGaN, GaN, AlGaN, InGaN, AlN, and InN and is doped with a first conductive dopant such as Si, Ge, or Sn.

The material forming the first semiconductor layer 11 is not limited thereto, and the first semiconductor layer 11 may be formed of various other materials.

The active layer 12 may be formed on the first semiconductor layer 11 and have a single or multiple quantum well structure. In an embodiment, a cladding layer (not illustrated) doped with a conductive dopant may be formed on and/or under the active layer 12. For example, the cladding layer may be formed as an AlGaN layer or an InAlGaN layer. A material such as AlGaN or AlInGaN may be used to form the active layer 12.

If an electric field having a predetermined voltage or more is applied to the opposite ends of the light emitting element LD, the light emitting element LD emits light by coupling or combining of electron-hole pairs in the active layer 12.

The second semiconductor layer 13 may be provided on the active layer 12 and include a semiconductor layer of a type different from that of the first semiconductor layer 11. For example, the second semiconductor layer 13 may include at least one p-type semiconductor layer. For instance, the second semiconductor layer 13 may include a semiconductor layer which includes at least one semiconductor material of InAlGaN, GaN, AlGaN, InGaN, AlN, and InN and is doped with a second conductive dopant such as Mg.

The material forming the second semiconductor layer 13 is not limited thereto, and the second semiconductor layer 13 may be formed of various other materials.

In an embodiment, the light emitting element LD may not only include the first semiconductor layer 11, the active layer 12, and the second semiconductor layer 13, but may also include another fluorescent layer, another active layer, another semiconductor layer, and/or another electrode layer provided on and/or under each layer (e.g., each of the first semiconductor layer 11, the active layer 12, and the second semiconductor layer 13).

In an embodiment, the light emitting element LD may further include at least one electrode layer disposed on a side (e.g., an upper surface) of the second semiconductor layer 13 or a side (e.g., a lower surface) of the first semiconductor layer 11. For example, as illustrated in FIG. 1B, the light emitting element LD may further include an electrode layer 15 disposed on a side of the second semiconductor layer 13. The electrode layer 15 may be an ohmic contact electrode, but the disclosure is not limited thereto. Furthermore, the electrode layer 15 may include metal or a metal oxide. For example, chromium (Cr), titanium (Ti), aluminium (Al), gold (Au), nickel (Ni), indium tin oxide (ITO), and an oxide or alloy thereof may be used alone or in any possible combination. However, the disclosure is not limited thereto. In an embodiment, the electrode layer 15 may be substantially transparent or translucent. Therefore, light generated from the light emitting element LD may be emitted to the outside after passing through the electrode layer 15.

The light emitting element LD may further include an insulating film 14. However, in an embodiment, the insulating film 14 may be omitted, or may be provided to cover some of the first semiconductor layer 11, the active layer 12, and the second semiconductor layer 13. For example, the insulating film 14 may be provided on a portion of the light emitting element LD, other than the opposite ends thereof, so that the opposite ends of the light emitting element LD are exposed.

For the sake of explanation, FIGS. 1A and 1B illustrate the insulating film 14 a portion of which has been removed. In the actual light emitting element LD, the entirety of the side surface of the cylindrical shape may be enclosed by the insulating film 14.

In an embodiment, the insulating film 14 may include transparent insulating material. For example, the insulating film 14 may include at least one or more insulating materials among $SiO_2$, $Si_3N_4$, $Al_2O_3$, and $TiO_2$, but the disclosure is not limited thereto. In other words, various materials having insulation properties may be employed.

If the insulating film 14 is provided on the light emitting element LD, the active layer 12 may be prevented from short-circuiting with a first and/or second electrode, which is not illustrated.

The type, structure, and shape, etc. of the light emitting element LD in accordance with an embodiment may be changed in various ways.

FIG. 2 is a plan view schematically illustrating a display device in accordance with an embodiment. FIG. 2 schematically illustrates the structure of a display panel PNL in accordance with an embodiment, focused on a display area DA. At least one driving circuit component (e.g., a scan driver and a data driver) and/or lines may be further provided on the display panel PNL.

Referring to FIGS. 1A and 2, the display panel PNL may include a substrate SUB and pixels PX1 and PX2 provided on the substrate SUB. In detail, the display panel PNL may include a display area DA for displaying an image, a non-display area NDA other than the display area DA. The pixels PX1 and PX2 may be successively arranged in the display area DA in a first direction DR1 and a second direction DR2

The display area DA may be disposed in a central area of the display panel PNL, and the non-display area NDA may be disposed in a peripheral area of the display panel PNL in such a way as to enclose the display area DA. The locations of the display area DA and the non-display area NDA are not limited thereto, and the locations thereof may be changed.

The substrate SUB may be a rigid substrate or a flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but the disclosure is not limited thereto. For instance, the substrate SUB may be a translucent substrate, an opaque substrate, or a reflective substrate.

An area on the substrate SUB is defined as the display area DA in which the pixels PX1 and PX2 are disposed, and the other area thereof is defined as the non-display area NDA. For example, various lines and/or internal circuit components which are electrically connected to the pixels PX1 and PX2 of the display area DA may be disposed in the non-display area NDA.

The pixels PX1 and PX2 may be arranged in the form of a matrix with rows and columns.

Each of the pixels PX1 and PX2 may include at least one light emitting element LD configured to be driven in response to a corresponding scan signal and a corresponding data signal. Light emitting elements may form a light source of each pixel PX1, PX2.

Each of the pixels PX1 and PX2 may be formed of sub-pixels. For example, the first pixel PX1 may include a first sub-pixel SPX1, a second sub-pixel SPX2, and a third sub-pixel SPX3. The second pixel PX2 may include a fourth sub-pixel SPX4, a fifth sub-pixel SPX5, and a sixth sub-pixel SPX6.

In an embodiment, the first to third sub-pixels SPX1 to SPX3 of the first pixel PX1 may emit different colors of light. For instance, the first sub-pixel SPX1 may be a red sub-pixel configured to emit red light, the second sub-pixel SPX2 may be a green sub-pixel configured to emit green light, and the third sub-pixel SPX3 may be a blue sub-pixel configured to emit blue light.

Furthermore, the fourth to sixth sub-pixels SPX4, SPX5, and SPX6 of the second pixel PX2 may also emit different colors of light. For instance, the fourth sub-pixel SPX4 may be a red sub-pixel configured to emit red light, the fifth sub-pixel SPX5 may be a green sub-pixel configured to emit green light, and the sixth sub-pixel SPX6 may be a blue sub-pixel configured to emit blue light.

The pixels PX1 and PX2 each may have a stripe type arrangement structure. In this case, the first sub-pixel SPX1 and the fourth sub-pixel SPX4 may emit light having the same color. The second sub-pixel SPX2 and the fifth sub-pixel SPX5 may emit light having the same color. The third sub-pixel SPX3 and the sixth sub-pixel SPX6 may emit light having the same color.

The colors, types, and/or numbers of sub-pixels that form each pixel PX1, PX2 are not particularly limited. For example, the color of light which is emitted from each of the first to sixth sub-pixels SPX1 to SPX6 may be changed in various ways. Although FIG. 2 illustrates an embodiment where the pixels PX1 and PX2 are arranged in a stripe type in the second direction DR2 in the display area DA, the disclosure is not limited thereto. For example, the display area DA may have various pixel arrangement shapes such as a mosaic type shape and a PenTile® type shape.

In an embodiment, each pixel PX1, PX2 (or each sub-pixel) may be formed of an active pixel. However, the types, structures, and/or driving methods of the pixels PX1 and PX2 capable of being applied to the disclosure are not particularly limited.

FIGS. 3A to 3D are circuit diagrams each schematically illustrating a sub-pixel in accordance with an embodiment. FIGS. 3A to 3D illustrate examples of a sub-pixel that forms an active emission display panel. Each sub-pixel SP of FIGS. 3A to 3D may be any of the first to sixth sub-pixels SPX1 to SPX6 of FIG. 2. In an embodiment, an emission area (or unit emission area) may be a sub-pixel area in which a single sub-pixel is provided.

Figure 3A:
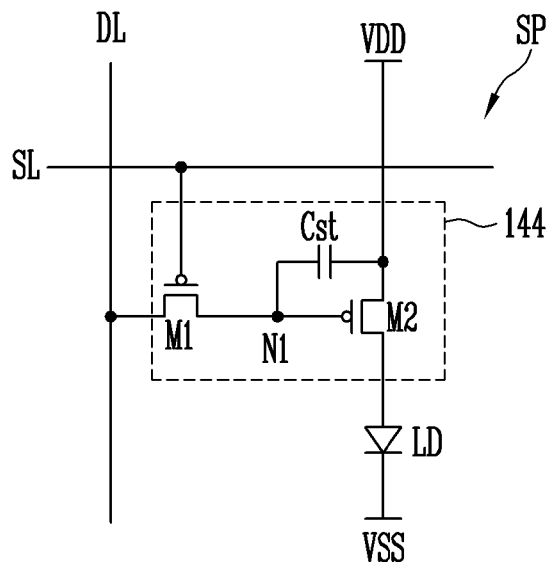
FIGS. 3A to 3D are circuit diagrams each schematically illustrating a sub-pixel in accordance with an embodiment.

Referring to FIG. 3A, a sub-pixel SP may include at least one light emitting element LD and a pixel driving circuit 144 which is electrically connected to the light emitting element LD and configured to drive the light emitting element LD.

A first electrode (e.g., an anode electrode) of the light emitting element LD may be electrically connected to a first driving power supply VDD via the pixel driving circuit 144. A second electrode (e.g., a cathode electrode) of the light emitting element LD may be electrically connected to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

Each of the light emitting elements LD may emit light at a luminance corresponding to driving current that is controlled by the pixel driving circuit 144.

Although FIG. 3A illustrates an embodiment in which the sub-pixel SP includes a light emitting element LD, the disclosure is not limited thereto. For example, the sub-pixel SP may include multiple light emitting elements LD electrically connected in parallel to each other.

In an embodiment, the pixel driving circuit 144 may include a first transistor M1, a second transistor M2, and a storage capacitor Cst. The structure of the pixel driving circuit 144 is not limited to that of the embodiment illustrated in FIG. 3A.

A first electrode of the first transistor (or switching transistor) M1 is electrically connected to a data line DL, and a second electrode thereof is electrically connected to a first node N1. Here, the first electrode and the second electrode of the first transistor M1 may be different electrodes. For example, if the first electrode is a source electrode, the second electrode is a drain electrode. A gate electrode of the first transistor M1 is electrically connected to a scan line SL.

In case that a scan signal having a voltage (e.g., a low-level voltage) capable of turning on the first transistor M1 is supplied from the scan line SL, the first transistor M1 is turned on to electrically connect the data line DL with the first node N1. In this case, a data signal of a corresponding frame is supplied to the data line DL, and thus the data signal is transmitted to the first node N1. The data signal transmitted to the first node N1 may be charged to the storage capacitor Cst.

A first electrode of the second transistor (driving transistor) M2 is electrically connected to the first driving power supply VDD, and a second electrode thereof is electrically connected to the first electrode of each of the light emitting elements LD. A gate electrode of the second transistor M2 is electrically connected to the first node N1. As such, the second transistor M2 may control the amount of driving current to be supplied to the light emitting elements LD in response to the voltage of the first node N1.

An electrode of the storage capacitor Cst is electrically connected to the first driving power supply VDD, and another electrode thereof is electrically connected to the first node N1. The storage capacitor Cst is charged with a voltage corresponding to a data signal supplied to the first node N1, and maintains the charged voltage until a data signal of a subsequent frame is supplied thereto.

For the sake of explanation, FIG. 3A illustrates the pixel driving circuit 144 having a relatively simple structure including the first transistor M1 configured to transmit the data signal to the sub-pixel SP, the storage capacitor Cst configured to store the data signal, and the second transistor M2 configured to supply driving current corresponding to the data signal to the light emitting element LD.

However, the disclosure is not limited thereto, and the structure of the pixel driving circuit 144 may be changed in various ways. For example, the pixel driving circuit 144 may further include at least one transistor element such as a transistor element configured to compensate for the threshold voltage of the second transistor M2, a transistor element configured to initialize the first node N1, and/or a transistor element configured to control an emission time of the light emitting element LD, or other circuit elements such as a boosting capacitor for boosting the voltage of the first node N1.

Furthermore, although FIG. 3A illustrates that the transistors, e.g., the first and second transistors M1 and M2, included in the pixel driving circuit 144 are formed of P-type transistors, the disclosure is not limited thereto. In other words, at least one of the first and second transistors M1 and M2 included in the pixel driving circuit 144 may be changed to an N-type transistor.

Figure 3B:
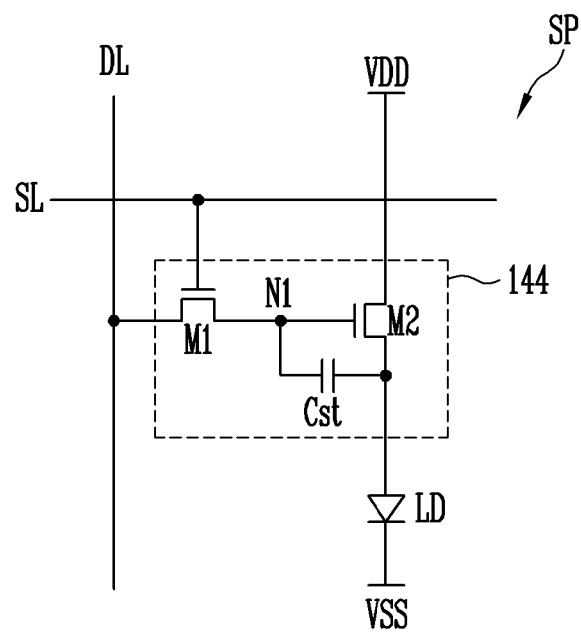

Referring to FIG. 3B, in an embodiment, the first and second transistors M1 and M2 may be implemented as N-type transistors. The configuration and operation of the pixel driving circuit 144 illustrated in FIG. 3B may be different from those of the pixel driving circuit 144 of FIG. 3A at least in a change in connection positions of some components due to a change in the type of transistor. Therefore, repetitive descriptions will be omitted.

Although FIGS. 3A and 3B illustrate that the light emitting element LD is electrically connected between the pixel driving circuit 144 and the second driving power supply VSS, the disclosure is not limited thereto. For example, the light emitting element LD may be electrically connected between the pixel driving circuit 144 and the first driving power supply VDD and emit light at a luminance corresponding to driving current that is controlled by the pixel driving circuit 144.

Figure 3C:
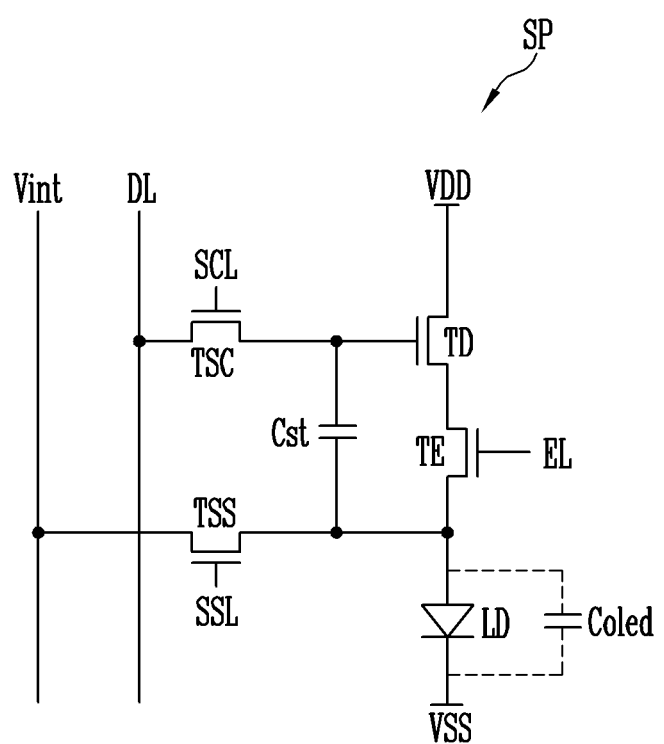

Referring to FIG. 3C, the sub-pixel SP may include a first transistor (or switching transistor) TSC, a second transistor (or driving transistor) TD, a third transistor (or sensing transistor) TSS, a fourth transistor (or emission control transistor) 1E, a storage capacitor Cst, and a light emitting element LD. In an embodiment, the fourth transistor TE may be omitted.

Although FIG. 3C illustrates that the first transistor TSC, the second transistor TD, the third transistor TSS, and the fourth transistor 1E each is an N-type transistor, the disclosure is not limited thereto. For example, at least one of the first transistor TSC, the second transistor TD, the third transistor TSS, and the fourth transistor 1E may be a P-type transistor.

A gate electrode of the first transistor TSC may be electrically connected to a scan line SCL. The first transistor TSC may transmit a data voltage to the sub-pixel SP in response to a scan signal supplied to the scan line SCL. A first electrode of the first transistor TSC may be electrically connected to the data line DL, and a second electrode thereof may be electrically connected to a gate electrode of the second transistor TD. A data voltage transmitted through the first transistor TSC may be stored in the storage capacitor Cst.

A first electrode of the second transistor TD may be electrically connected to the first driving power supply VDD, and a second electrode thereof may be electrically connected to a first electrode of the fourth transistor TE. The gate electrode of the second transistor TD may be electrically connected to the second electrode of the first transistor TSC. The second transistor TD may determine the amount of driving current that flows to the light emitting element LD, depending on the level of a data voltage (a data signal) stored in the storage capacitor Cst. In an embodiment, in case that the sub-pixel SP does not include the fourth transistor TE, the second electrode of the second transistor TD may be electrically connected to the anode electrode of the light emitting element LD.

A gate electrode of the third transistor TSS may be electrically connected to a sensing line SSL. A first electrode of the third transistor TSS may be electrically connected to an initialization power supply Vint, and a second electrode thereof may be electrically connected to the anode electrode of the light emitting element LD. The third transistor TSS may transmit an initialization voltage to the sub-pixel SP in response to a sensing signal supplied to the sensing line SSL, or sense a voltage value at the anode electrode of the light emitting element LD.

A gate electrode of the fourth transistor TE may be electrically connected to an emission control line EL. The fourth transistor 1E may be electrically connected between the second transistor TD and the light emitting element LD. The fourth transistor 1E may be selectively turned on in response to an emission signal.

The storage capacitor Cst may be electrically connected between the gate electrode of the second transistor TD and the anode electrode of the light emitting element LD. The storage capacitor Cst may store a voltage corresponding both to a data voltage applied thereto through the first transistor TSC and to a threshold voltage of the second transistor TD.

An anode electrode of the light emitting element LD may be electrically connected to the second transistor TD via the fourth transistor TE, and a cathode electrode thereof may be electrically connected to the second driving power supply VSS. The light emitting element LD may generate light having a predetermined luminance corresponding to the amount of current supplied from the second transistor TD.

A parasitic capacitor Coled may occur between the anode electrode and the cathode electrode of the light emitting element LD. In case that the parasitic capacitor Coled is charged, the light emitting element LD may easily emit light even with low current. In case that a voltage of the initialization power supply Vint is supplied to the anode electrode of the light emitting element LD through the third transistor TSS, the parasitic capacitor Coled is discharged, and thus black expression performance of the display device may be enhanced.

Figure 3D:
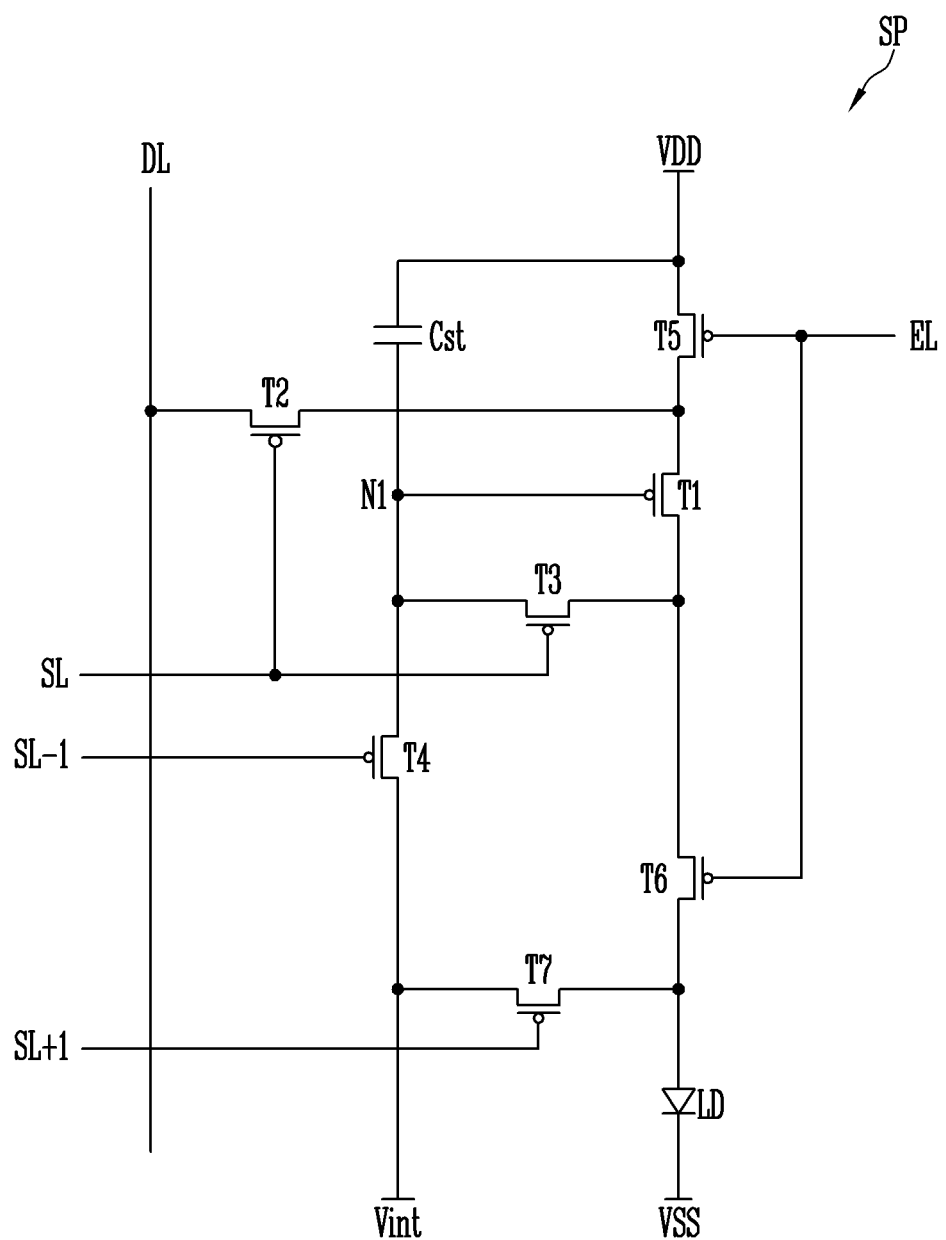

Referring to FIG. 3D, the sub-pixel SP may include first to seventh transistors T1, T2, T3, T4, T5, T6, and T7, a storage capacitor Cst, and a light emitting element LD.

Although FIG. 3D illustrates that the first to seventh transistors T1, T2, T3, T4, T5, T6, and T7 are formed of P-type transistors, the disclosure is not limited thereto. For example, at least one of the first to seventh transistors T1, T2, T3, T4, T5, T6, and T7 may be changed to an N-type transistor.

A first electrode (e.g., an anode electrode) of the light emitting element LD may be electrically connected to the first transistor T1 via the sixth transistor T6. A second electrode (e.g., a cathode electrode) of the light emitting element LD may be electrically connected to a second driving power supply VSS. The light emitting element LD may emit light having a predetermined luminance corresponding to current supplied from the first transistor T1.

The first transistor (or driving transistor) T1 may include a first electrode electrically connected to the first driving power supply VDD via the fifth transistor T5, and a second electrode electrically connected to a first electrode of the light emitting element LD via the sixth transistor T6. The first transistor T1 may control the amount of current flowing from the first driving power supply VDD via the light emitting element LD to the second driving power supply VSS in response to the voltage of a first node N1, which is a gate electrode thereof.

The second transistor (or switching transistor) T2 may be electrically connected between a data line DL and the first electrode of the first transistor T1. A gate electrode of the second transistor T2 may be electrically connected to a scan line SL. In case that a scan signal having a gate-on voltage is supplied to the scan line SL, the second transistor T2 may be turned on so that the data line DL may be electrically connected with the first electrode of the first transistor T1.

The third transistor T3 may be electrically connected between the second electrode of the first transistor T1 and the first node N1. A gate electrode of the third transistor T3 may be electrically connected to the scan line SL. In case that a scan signal having a gate-on voltage is supplied from the scan line SL, the third transistor T3 may be turned on so that the second electrode of the first transistor T1 may be electrically connected with the first node N1.

The fourth transistor T4 may be electrically connected between the first node N1 and an initialization power supply Vint. A gate electrode of the fourth transistor T4 may be electrically connected to a scan line SL-1 of a preceding stage. In case that a scan signal having a gate-on voltage is supplied to the scan line SL-1 of the preceding stage, the fourth transistor T4 is turned on so that the voltage of the initialization power supply Vint may be supplied to the first node N1. The initialization power supply Vint may be set to a voltage lower than that of a data signal.

The fifth transistor T5 may be electrically connected between the first driving power supply VDD and the first electrode of the first transistor T1. A gate electrode of the fifth transistor T5 may be electrically connected to an i-th emission control line EL. The fifth transistor T5 may be turned on in case that an emission control signal having a gate-on voltage is supplied to the i-th emission control line EL, and may be turned off in other cases.

The sixth transistor T6 may be electrically connected between the second electrode of the first transistor T1 and the first electrode of the light emitting element LD. A gate electrode of the sixth transistor T6 may be electrically connected to the emission control line EL. The sixth transistor T6 may be turned on in case that an emission control signal having a gate-on voltage is supplied to the emission control line EL, and may be turned off in other cases.

The seventh transistor T7 may be electrically connected between the initialization power supply Vint and the first electrode of the light emitting element LD. A gate electrode of the seventh transistor T7 may be electrically connected to a scan line SL+1 of a subsequent stage. In case that a scan signal having a gate-on voltage is supplied to the scan line SL+1 of the subsequent stage, the seventh transistor T7 may be turned on so that the voltage of the initialization power supply Vint may be supplied to the first electrode of light emitting element LD.

The storage capacitor Cst may be electrically connected between the first driving power supply VDD and the first node N1. The storage capacitor Cst may store a voltage corresponding both to a data signal and to a threshold voltage of the first transistor T1.

Figure 4A:
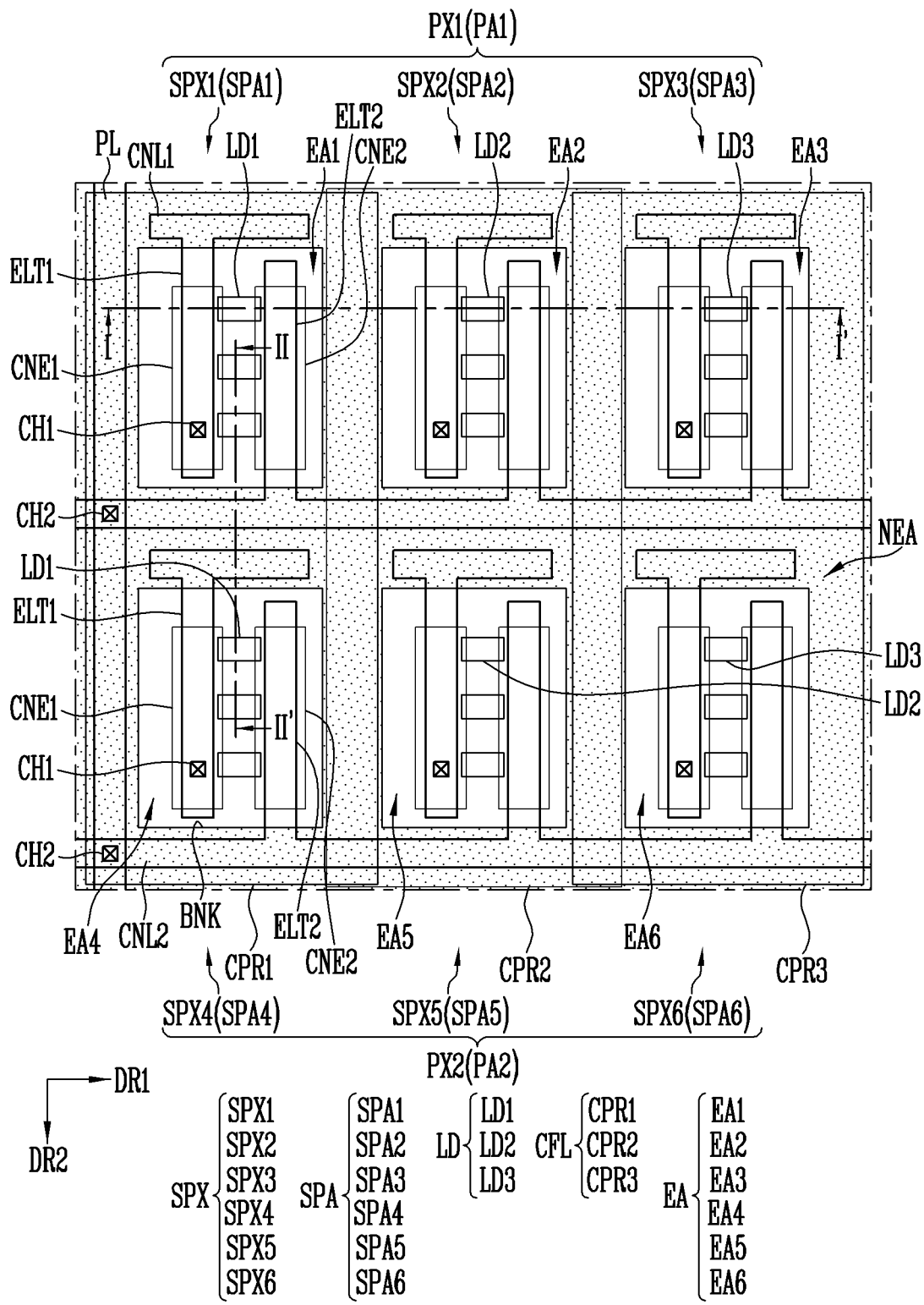
FIG. 4A is a plan view schematically illustrating a display device in accordance with an embodiment.
Figure 4B:
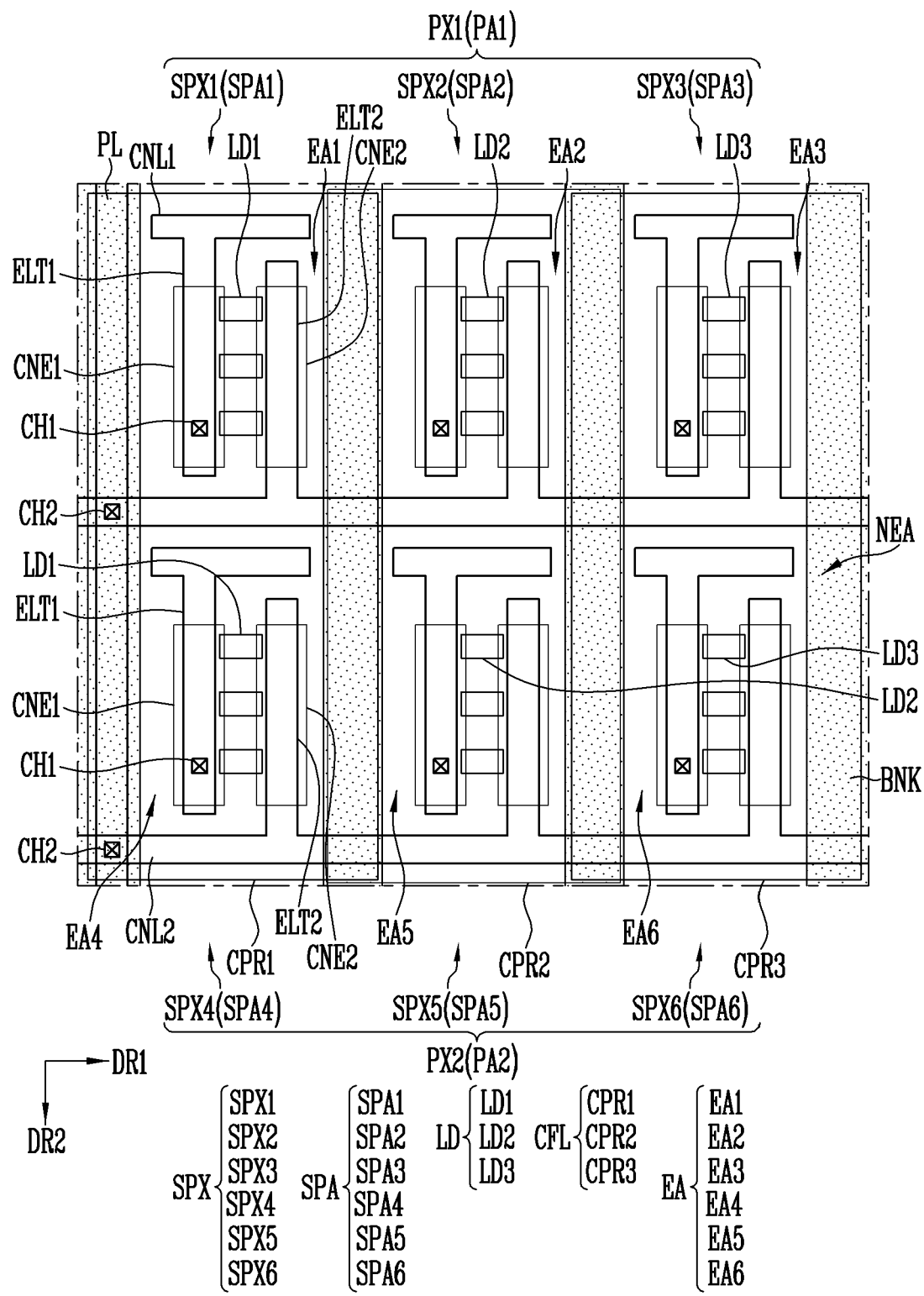
FIG. 4B schematically illustrates a modified example of a structure illustrated in FIG. 4A.

FIG. 4A is a schematic plan view illustrating a display device in accordance with an embodiment. FIG. 4B illustrates a modified example of a structure illustrated in FIG. 4A.

FIGS. 4A and 4B are schematic plan views each illustrating a structure of the display panel PNL (see FIG. 2) in accordance with an embodiment and, for example, are schematic plan views illustrating a first pixel area PA1 and a second pixel area PA2 of the pixels illustrated in FIG. 2.

For the sake of explanation, FIGS. 4A and 4B illustrate a simplified structure of each electrode, e.g., showing that the electrode is formed as a signal electrode layer. However, the disclosure is not limited thereto.

Referring to FIGS. 4A and 4B, each pixel area PA1 or PA2 may include sub-pixel areas SPA which form respective sub-pixels SPX. For example, the first pixel area PA1 may include, successively in the first direction DR1, a first sub-pixel area SPA1 in which a first sub-pixel SPX1 is formed, a second sub-pixel area SPA2 in which a second sub-pixel SPX2 is formed, and a third sub-pixel area SPA3 in which a third sub-pixel SPX3 is formed.

The second pixel area PA2 may be spaced apart from the first pixel area PA1 in the second direction DR and include, successively in the first direction DR1, a fourth sub-pixel area SPA4 in which a fourth sub-pixel SPX4 is formed, a fifth sub-pixel area SPA5 in which a fifth sub-pixel SPX5 is formed, and a sixth sub-pixel area SPA6 in which a sixth sub-pixel SPX6 is formed.

Hereinafter, the first pixel PX1 will be mainly described, and detailed descriptions of the second pixel PX2 will be simplified or omitted because it is equal or similar to the first pixel PX1.

Each sub-pixel area SPA may include a first pixel electrode ELT1, a second pixel electrode ELT2, and light emitting elements LD electrically connected between the first and second pixel electrodes ELT1 and ELT2.

The first pixel electrode ELT1 and the second pixel electrode ELT2 may be spaced apart from each other and may be disposed such that at least portions thereof face each other. For example, in each sub-pixel area SPA, the first and second pixel electrodes ELT1 and ELT2 may be disposed parallel to each other at positions spaced apart from each other by a predetermined distance in the first direction DR1, and extend in the second direction DR2.

The first pixel electrode ELT1 may be electrically connected to a pixel circuit of each sub-pixel SPX, e.g., to the pixel driving circuit 144 illustrated in any of FIGS. 3A and 3B, through a first contact hole CH1. In an embodiment, each pixel driving circuit 144 may be disposed under the light emitting elements LD disposed in the corresponding sub-pixel area SPA. For example, each pixel driving circuit 144 may be formed on a pixel circuit layer PCL (see FIG. 5) to be described below.

The first pixel electrode ELT1 may be electrically connected to a first connection electrode CNL1. For instance, the first pixel electrode ELT1 may be integrally and electrically connected to the first connection electrode CNL1. For example, the first pixel electrode ELT1 may be formed of at least one branch diverging from the first connection electrode CNL1.

The first pixel electrode ELT1 and the first connection electrode CNL1 may extend in different directions in each sub-pixel area SPA. For example, in case that the first connection electrode CNL1 extends in the first direction DR1, the first pixel electrode ELT1 may extend in the second direction DR2 intersecting the first direction DR1.

The second pixel electrode ELT2 may be electrically connected to the second driving power supply VSS. For example, the second pixel electrode ELT2 may be electrically connected to the second driving power supply VSS via a second connection electrode CNL2, a second contact hole CH2, and a power line PL. An area of the power line PL for supplying a voltage of the second driving power supply VSS may be disposed on the pixel circuit layer PCL under the light emitting elements LD, but the disclosure is not limited thereto.

The second pixel electrode ELT2 and the second connection electrode CNL2 may extend in different directions in each sub-pixel area SPA. For example, in case that the second connection electrode CNL2 extends in the first direction DR1, the second pixel electrode ELT2 may extend in the second direction DR2.

The second pixel electrode ELT2 and the second connection electrode CNL2 may be integrally and electrically connected to each other. For example, the second pixel electrode ELT2 may be formed of at least one branch diverging from the second connection electrode CNL2.

Light emitting elements LD may be arranged between the first and second pixel electrodes ELT1 and ELT2 of each sub-pixel SPX. For example, at least one first light emitting element LD1 may be disposed between the first and second pixel electrodes ELT1 and ELT2 of the first sub-pixel SPX1. At least one second light emitting element LD2 may be disposed between the first and second pixel electrodes ELT1 and ELT2 of the second sub-pixel SPX2. At least one third light emitting element LD3 may be disposed between the first and second pixel electrodes ELT1 and ELT2 of the third sub-pixel SPX3.

For example, in each sub-pixel area SPA, light emitting elements LD may be electrically connected in parallel to each other in an area (e.g., an emission area EA of each sub-pixel SPX) in which the first pixel electrode ELT1 and the second pixel electrode ELT2 are disposed facing each other.

Although FIG. 4A illustrates that the light emitting elements LD are aligned in the first direction DR1, the alignment direction of the light emitting elements LD is not limited thereto. For example, at least one of the light emitting elements LD may be disposed in a diagonal direction.

The light emitting elements LD may include first, second, and third light emitting elements LD1, LD2, and LD3. The first, second, and third light emitting elements LD1, LD2, and LD3 may emit different colors of light. For example, the first light emitting element LD1 may emit red light, the second light emitting element LD2 may emit green light, and the third light emitting element LD3 may emit blue light.

The light emitting elements LD may be electrically connected between the first and second pixel electrodes ELT1 and ELT2 of each sub-pixel SPX. An end (hereinafter, referred to as "first end") of each of the light emitting elements LD may be electrically connected to the first pixel electrode ELT1 of the corresponding sub-pixel SPX, and another end (hereinafter, referred to as "second end") of the light emitting element LD may be electrically connected to the second pixel electrode ELT2 of the corresponding sub-pixel SPX.

In an embodiment, the first ends of the light emitting elements LD may be electrically connected to the corresponding first pixel electrode ELT1 through a first contact electrode CNE1, rather than being directly disposed on the first pixel electrode ELT1.

Likewise, the second ends of the light emitting elements LD may be electrically connected to the corresponding second pixel electrode ELT2 through a second contact electrode CNE2, rather than being directly disposed on the second pixel electrode ELT2.

However, the disclosure is not limited thereto. For example, in an embodiment, the first ends and the second ends of the light emitting elements LD may respectively and directly contact the first pixel electrode ELT1 and the second pixel electrode ELT2 and be electrically connected thereto.

As described with reference to FIGS. 1A and 1B, the light emitting elements LD each may be a light emitting diode that is formed of material having an inorganic crystalline structure and has a small size of the nanometer scale or the micrometer scale.

The light emitting elements LD may be prepared dispersed in a predetermined solution and then supplied to the emission area EA of each sub-pixel SPX by an inkjet printing method or the like. For example, the light emitting elements LD may be mixed with a volatile solvent and supplied to each emission area EA.

Here, if a predetermined voltage is supplied to each sub-pixel SPX through the first and second pixel electrodes ELT1 and ELT2, an electric field is formed between the first and second pixel electrodes ELT1 and ELT2, and thus the light emitting elements LD may be self-aligned between the first and second pixel electrodes ELT1 and ELT2.

After the light emitting elements LD have been aligned, the solvent may be removed by a volatilization method or other methods, so that the light emitting elements LD may be reliably arranged between the first and second pixel electrodes ELT1 and ELT2. Furthermore, since the first contact electrode CNE1 and the second contact electrode CNE2 are respectively formed on the first and second ends of the light emitting elements LD, the light emitting elements LD may be reliably connected between the first and second pixel electrodes ELT1 and ELT2.

The light emitting elements LD disposed in each sub-pixel area SPA may collectively form a light source of the corresponding sub-pixel SPX. If driving current flows through at least one sub-pixel SPX during each frame period, the light emitting elements LD that are electrically connected in a forward direction between the first and second pixel electrodes ELT1 and ELT2 of the sub-pixel SPX may emit light having a luminance corresponding to the driving current.

Each sub-pixel area SPA may include an emission area EA and a non-emission area NEA. The emission area EA may be an area in which the above-mentioned light emitting elements LD are disposed, and which emits light. The non-emission area NEA may be an area which does not emit light, other than the emission area EMA. The non-emission area NEA may be disposed along a boundary between the respective sub-pixels SPX.

A bank layer BNK may be disposed to overlap the non-emission area NEA, in a plan view. In other words, in a plan view, at least one light emitting element LD disposed in the emission area EA of each sub-pixel area SPA may be enclosed by the bank layer BNK disposed in the corresponding sub-pixel area SPA.

Each emission area EA may be defined by the bank layer BNK. For example, the first sub-pixel area SPA1 may include a first emission area EA1, the second sub-pixel area SPA2 may include a second emission area EA2, and the third sub-pixel area SPA3 may include a third emission area EA3. Similarly, the fourth sub-pixel area SPA4 may include a fourth emission area EA4, the fifth sub-pixel area SPA5 may include a fifth emission area EA5, and the sixth sub-pixel area SPA6 may include a sixth emission area EA6.

As illustrated in FIG. 4A, the bank layer BNK may be integrally provided and disposed. In other words, the bank layer BNK may be a bank or integrated partition wall having a mesh shape to expose the respective emission areas EA of the sub-pixel areas SPA.

However, the shape of the bank layer BNK is not limited to the foregoing example. In an embodiment, the bank layer BNK may be formed of individual patterns separated from each other. For example, as illustrated in FIG. 4B, respective bank layers BNK may be spaced apart from each other by a predetermined distance in the first direction DR1 and disposed in a shape extending in the second direction DR2.

The bank layer BNK may include one or more organic layers formed of photoresist-based organic material or the like, but the disclosure is not limited thereto.

In an embodiment, a reflective layer, etc. may be additionally provided on a surface of the bank layer BNK. In this case, the reflective layer may reflect, to the outside, light emitted from the light emitting elements LD, and improve the light efficiency of the sub-pixels SPX.

In an embodiment, a color filter CFL may be disposed on each sub-pixel SPX. For example, a first color filter pattern CPR1 may be disposed on the first sub-pixel SPX1 and the fourth sub-pixel SPX4. A second color filter pattern CPR2 may be disposed on the second sub-pixel SPX2 and the fifth sub-pixel SPX5. A third color filter pattern CPR3 may be disposed on the third sub-pixel SPX3 and the sixth sub-pixel SPX6. The respective first to third color filter patterns CPR1 to CPR3 may at least partially overlap each other, and the overlapped area may at least partially overlap the non-emission area NEA. In other words, the respective first to third color filter patterns CPR1 to CPR3 may at least partially overlap each other in the non-emission area NEA. Each of the first to third color filter patterns CPR1 to CPR3 may markedly reduce the reflectivity of external light that is incident on the display device. An external light reflection effect of the color filter CFL will be described in detail below with reference to FIG. 7.

Figure 5:
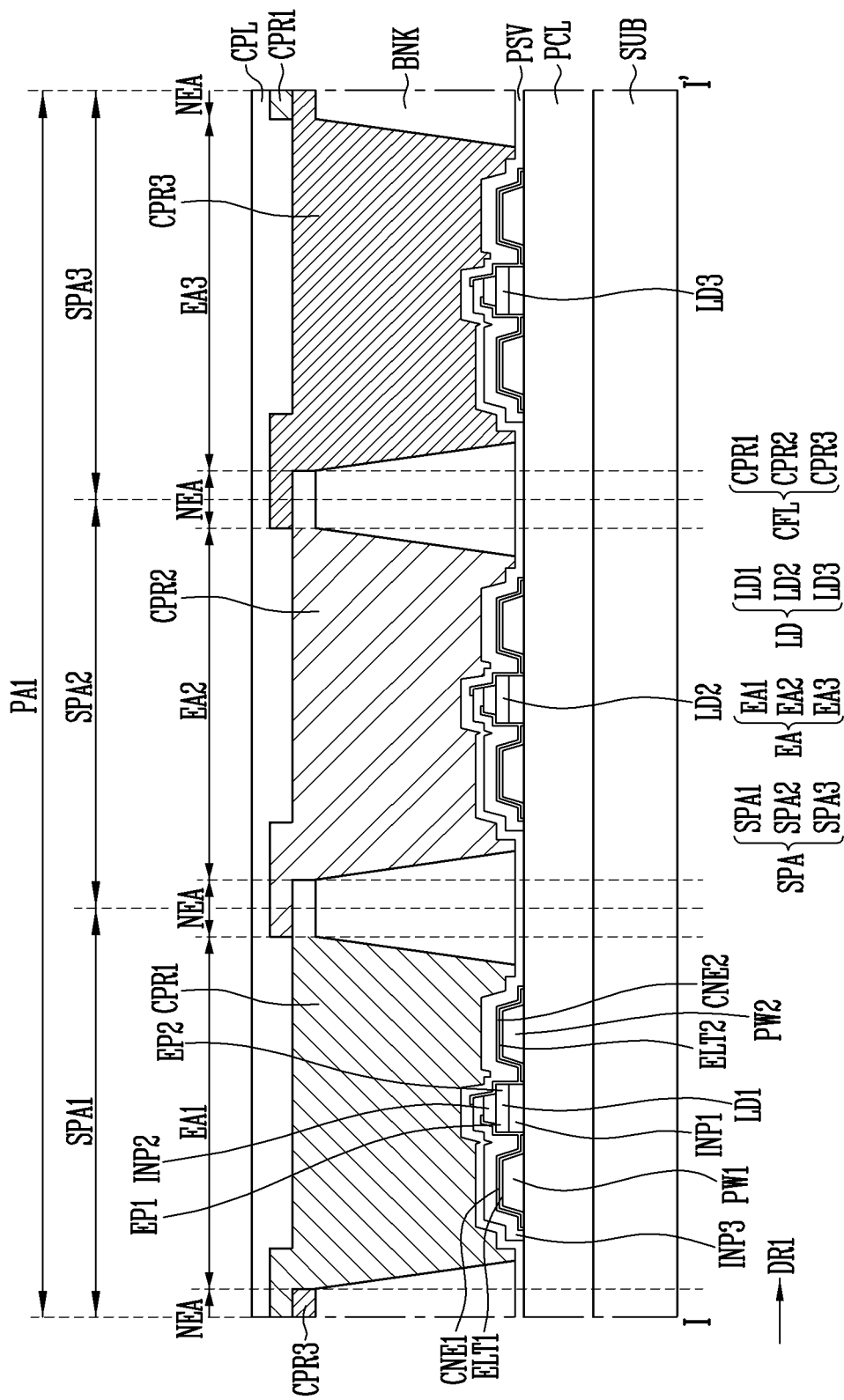
FIG. 5 schematically illustrates an example of a cross-sectional view of a pixel, taken along line I-I' of FIG. 4A.
Figure 6:
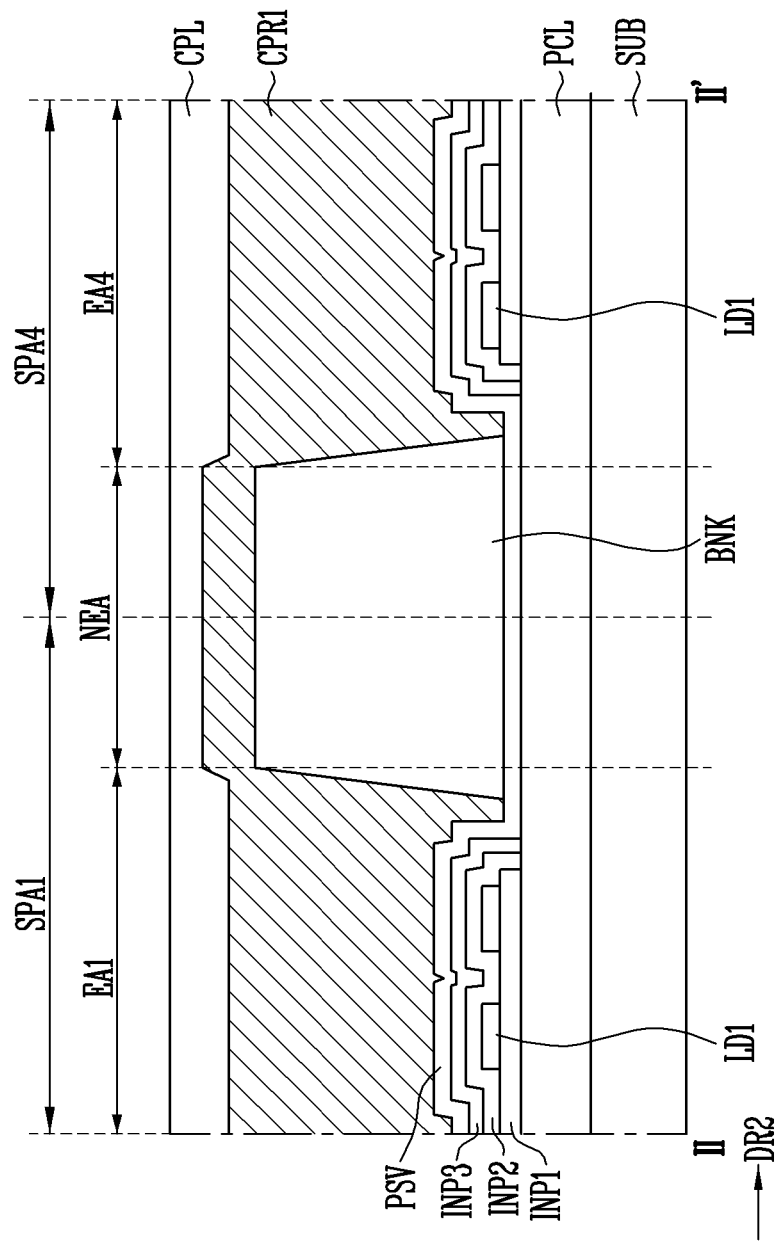
FIG. 6 is a cross-sectional view of pixels, taken along line II-II' of FIG. 4A.

FIG. 5 illustrates an example of a schematic cross-sectional view of a pixel taken along line I-I' of FIG. 4A. FIG. 6 is a schematic cross-sectional view of pixels, taken along line II-II' of FIG. 4A.

Referring to FIGS. 1A to 6, the pixel circuit layer PCL and the light emitting elements LD may be successively disposed on the substrate SUB.

The pixel circuit layer PCL may include circuit elements which are formed in each sub-pixel area SPA and form the pixel driving circuit 144 of the corresponding sub-pixel SPX. For instance, the pixel circuit layer PCL may include at least one transistor M1 or M2 and a storage capacitor Cst which are disposed in each sub-pixel area SPA (see FIG. 3A).

The transistors M1 and M2 and the storage capacitor Cst that are disposed on the pixel circuit layer PCL may be electrically connected with the first pixel electrode ELT1 or the second pixel electrode ELT2 through at least one contact hole formed in the pixel circuit layer PCL.

Light emitting elements LD may be disposed in each sub-pixel area SPA over the pixel circuit layer PCL. As described above, the first to third light emitting elements LD1 to LD3 may be respectively disposed in the first to third sub-pixel areas SPA1 to SPA3.

In detail, the first and second pixel electrodes ELT1 and ELT2 may be disposed in each sub-pixel area SPA. The light emitting elements LD may be disposed between the first and second pixel electrodes ELT1 and ELT2 corresponding to each other. The first and second contact electrodes CNE1 and CNE2 may be respectively disposed on first and second ends EP1 and EP2 of the light emitting elements LD. The color filter CFL may be disposed on the light emitting elements LD.

At least one conductive layer and/or at least one insulating layer (or insulating pattern) or the like may be further provided on the pixel circuit layer PCL. For example, at least one of first and second partition walls (or first and second banks) PW1 and PW2, first, second, and third insulating patterns INP1, INP2, and INP3, and a passivation layer PSV may be further provided on the pixel circuit layer PCL.

The first and second partition walls PW1 and PW2 may be selectively disposed on the pixel circuit layer PCL. The first and second partition walls PW1 and PW2 may be disposed at positions spaced apart from each other by a predetermined distance on the pixel circuit layer PCL. The material and/or stacked structure of the first and second partition walls PW1 and PW2 may be changed in various ways rather than being particularly limited.

Each of the first and second partition walls PW1 and PW2 may have various shapes. For example, as illustrated in FIG. 5, each of the first and second partition walls PW1 and PW2 may have the cross-sectional shape of a trapezoid, a width of which reduces from the bottom to the top thereof. As another example, each of the first and second partition walls PW1 and PW2 may have a curved surface having, e.g., a cross-section of a semi-circle or a semi-ellipse a width of which reduces from the bottom to the top thereof. The shape of each of the first and second partition walls PW1 and PW2 may be changed in various ways rather than being particularly limited.

The first and second pixel electrodes ELT1 and ELT2 and the first and second connection electrodes CNL1 and CNL2 may be disposed in each sub-pixel area SPA provided with the first and second partition walls PW1 and PW2.

The first and second pixel electrodes ELT1 and ELT2 may be disposed at positions spaced apart from each other by a predetermined distance on the substrate SUB on which the pixel circuit layer PCL and/or the first and second partition walls PW1 and PW2 are formed. The first and second connection electrodes CNL1 and CNL2 may be respectively, integrally, and electrically connected with the first and second pixel electrodes ELT1 and ELT2.

The first pixel electrodes ELT1 may be disposed on the respective first partition walls PW1, and the second pixel electrodes ELT2 may be disposed on the respective second partition walls PW2. In an embodiment, any of the first and second pixel electrodes ELT1 and ELT2 may be an anode electrode, and the other may be a cathode electrode.

The first and second pixel electrodes ELT1 and ELT2 may respectively have shapes corresponding to those of the first and second partition walls PW1 and PW2. For example, each of the first pixel electrodes ELT1 may have an inclination corresponding to the cross-section of the corresponding first partition wall PW1, and each of the second pixel electrodes ELT2 may have an inclination corresponding to the cross-section of the corresponding second partition wall PW2.

In an embodiment, the first and second partition walls PW1 and PW2 may not be provided in each sub-pixel area SPA. In this case, each of the first and second pixel electrodes ELT1 and ELT2 may have a substantially planar shape.

The first and second pixel electrodes ELT1 and ELT2 may be disposed on the same plane and have the same height. As such, if the first and second pixel electrodes ELT1 and ELT2 have the same height, the light emitting elements LD may be more reliably connected between the first and second pixel electrodes ELT1 and ELT2. However, the disclosure is not limited thereto. For example, the shapes, structures, and/or relative disposition relationship of the first and second pixel electrodes ELT1 and ELT2 may be changed in various ways.

In an embodiment, each of the first and second pixel electrodes ELT1 and ELT2 may include a reflective electrode, but the disclosure is not limited thereto. For example, each of the first and second pixel electrodes ELT1 and ELT2 may be formed of conductive material having a predetermined reflectivity. For example, the first and second pixel electrodes ELT1 and ELT2 may include at least one of metals such as Ag, Mg, Al, Pt, Pd, Au, Ni, Nd, Ir, Cr, and an alloy thereof; however, the disclosure is not limited thereto. For example, the first and second pixel electrodes ELT1 and ELT2 each may include any of conductive oxide such as indium tin oxide (ITO), indium zinc oxide (IZO), zinc oxide (ZnO), and indium tin zinc oxide (ITZO), and a conductive polymer such as poly(3,4-ethylenedioxythiophene) (PEDOT). In this case, the first and second pixel electrodes ELT1 and ELT2 may further include a separate reflective layer.

If the first and second pixel electrodes ELT1 and ELT2 respectively have inclinations corresponding to the shapes of the first and second partition walls PW1 and PW2, light emitted from the first and second ends EP1 and EP2 of each of the light emitting elements LD may be reflected by the first and second pixel electrodes ELT1 and ELT2 and travel in a frontal direction.

In an embodiment, a first insulating pattern INP1 may be disposed in each sub-pixel area SPA provided with the first and second pixel electrodes ELT1 and ELT2, etc. In an embodiment, the first insulating pattern INP1 may be disposed between the pixel circuit layer PCL and the light emitting elements LD. The first insulating pattern INP1 may stably support the light emitting elements LD.

At least one light emitting element LD, e.g., light emitting elements LD, may be provided and aligned in each sub-pixel area SPA provided with the first insulating pattern INP1. For example, first light emitting elements LD1 may be provided and aligned in each first sub-pixel area SPA1.

A second insulating pattern INP2 that covers (or overlaps) portions of respective upper surfaces of the light emitting elements LD may be disposed in each sub-pixel area SPA provided with the light emitting elements LD.

The first contact electrode CNE1 may be disposed in each sub-pixel area SPA provided with the second insulating pattern INP2. The first contact electrode CNE1 may cover the first pixel electrode ELT1 and be electrically connected to the first pixel electrode ELT1. Furthermore, the first contact electrode CNE1 may cover the first end EP1 of at least one light emitting element LD disposed in the sub-pixel area SPA and electrically connect the first end EP1 to the corresponding first pixel electrode ELT1.

A third insulating pattern INP3 may be disposed in each sub-pixel area SPA provided with the first contact electrode CNE1. The third insulating pattern INP3 may be provided to cover the corresponding first contact electrode CNE1.

The second contact electrode CNE2 may be disposed in each sub-pixel area SPA provided with the third insulating pattern INP3. Each second contact electrode CNE2 may cover the corresponding second pixel electrode ELT2 and be electrically connected to the second pixel electrode ELT2. Furthermore, each second contact electrode CNE2 may cover the second end EP2 of at least one light emitting element LD disposed in the corresponding sub-pixel area SPA and electrically connect the second end EP2 to the corresponding second pixel electrode ELT2.

The passivation layer PSV may be disposed in each sub-pixel area SPA provided with the second contact electrode CNE2. In an embodiment, the passivation layer PSV may be formed in the entirety of the display area DA and completely cover the light emitting elements LD and the electrodes electrically connected thereto.

The bank layer BNK and the color filter CFL may be disposed on a surface of the substrate SUB on which the light emitting elements LD are disposed. The bank layer BNK may be formed on the passivation layer PSV disposed on a surface of the substrate SUB, and may be directly formed on a surface of the substrate SUB depending on embodiments.

The bank layer BNK may be disposed between the first to third sub-pixels SPX1 to SPX3. For example, the bank layer BNK may be disposed in a boundary area in which the first to third sub-pixel areas SPA1 to SPA3 border each other. The bank layer BNK may prevent light leakage from occurring between adjacent sub-pixels SPX.

In some embodiments, the bank layer BNK may have various shapes. For example, the bank layer BNK may have a shape capable of satisfying a viewing angle of a predetermined value or more. For example, as illustrated in FIGS. 5 and 6, the bank layer BNK may have a trapezoidal cross-section, a width of which reduces away from the substrate SUB. As another example, the bank layer BNK may have a curved cross-section such as a semi-circular cross-section or a semi-elliptical cross-section, a width of which reduces upward away from the substrate SUB. In the present disclosure, the shape and/or inclination of the bank layer BNK is not particularly limited, and it may be changed in various ways.

Each of the sub-pixel areas SPA may include an emission area EA and a non-emission area NEA. The emission area EA may be an area which includes light emitting elements LD disposed on the substrate SUB, and from which light emitted from the light emitting elements LD is output to the outside. The non-emission area NEA may be an area which does not include the light emitting elements LD, and which encloses the emission areas EA along the respective boundaries of the sub-pixel areas SPA. In other words, the non-emission area NEA may be an area defined to overlap the bank layer BNK.

The color filter CFL may be disposed on the light emitting elements LD and the bank layer BNK. The color filter CFL may include first to third color filter patterns CPR1 to CPR3 which are respectively disposed in the first to third sub-pixel areas SPA1 to SPA3. The color filter CFL may be disposed not only in each of the sub-pixel areas SPA but also in the non-emission area NEA adjacent to each of the sub-pixel areas SPA.

The color filter CFL may be formed to be higher than the bank layer BNK. In this case, the first to third color filter patterns CPR1 to CPR3 may at least partially overlap each other on the bank layer BNK. For example, the first color filter pattern CPR1 and the second color filter pattern CPR2 may be disposed to overlap each other on the bank layer BNK between the first sub-pixel SPX1 and the second sub-pixel SPX2. The second color filter pattern CPR2 and the third color filter pattern CPR3 may be disposed to overlap each other on bank layer BNK between the second sub-pixel SPX2 and the third sub-pixel SPX3.

Each of the first to third color filter patterns CPR1 to CPR3 may allow a portion of light having a specific wavelength emitted from the light emitting elements LD to transmit therethrough, and partially absorb the other light.

For example, the first color filter pattern CPR1 may be a red color filter. In other words, the first color filter pattern CPR1 may allow light having a red wavelength to selectively transmit therethrough, and may partially absorb light of wavelength bands adjacent to the red wavelength, thus making it possible to sharpen a wavelength spectrum of red light that is expressed (or displayed) by the first sub-pixel SPX1, thereby improving the color purity.

The second color filter pattern CPR2 may be a green color filter. The second color filter pattern CPR2 may allow green light to selectively transmit therethrough, and may partially absorb light of wavelength bands adjacent to a green wavelength, thus making it possible to sharpen a wavelength spectrum of green light that is expressed by the second sub-pixel SPX2.

The third color filter pattern CPR3 may be a blue color filter. The third color filter pattern CPR3 may allow blue light to selectively transmit therethrough, and may partially absorb light of wavelength bands adjacent to a blue wavelength, thus making it possible to sharpen a wavelength spectrum of blue light that is expressed by the third sub-pixel SPX3.

In other words, in case that the first to third color filter patterns CPR1 to CPR3 are disposed on the respective light emitting elements LD, the display device may secure excellent color reproducibility.

As illustrated in FIG. 4A, the first to third color filter patterns CPR1 to CPR3 may extend in the second direction DR2, so that as illustrated in FIG. 6, the first color filter pattern CPR1 may also be disposed in the fourth sub-pixel area SPA4. Likewise, the second color filter pattern CPR2 may also be disposed in the fifth sub-pixel area SPA5, and the third color filter pattern CPR3 may also be disposed in the sixth sub-pixel area SPA6.

In an embodiment, a capping layer CPL may be further disposed on the color filter CFL. The capping layer CPL may be disposed to cover the entirety of the color filter CFL and thus protect the color filter CFL from external impurities.

Figure 7:
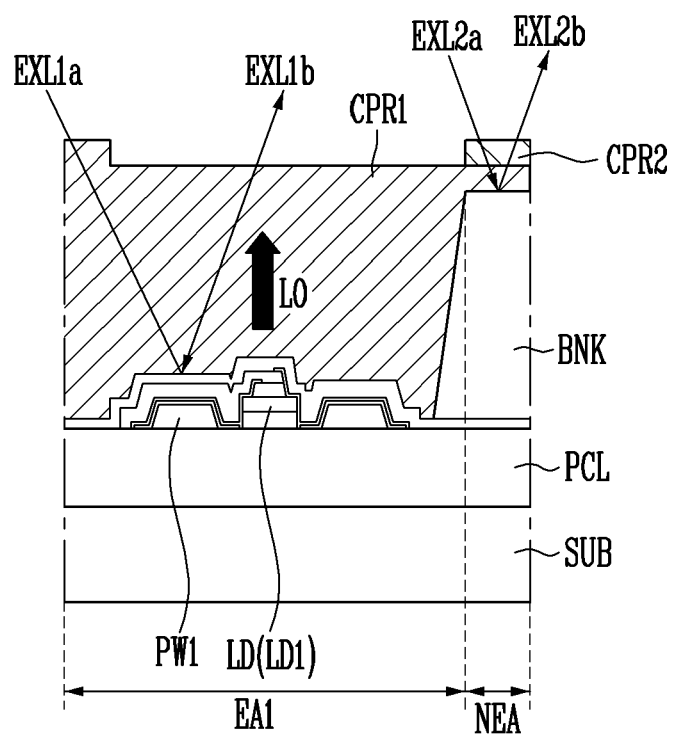
FIG. 7 is a diagram for describing an external light reflection reduction effect and a color reproducibility improvement effect of a display device in accordance with an embodiment.

FIG. 7 is a schematic diagram for describing an external light reflection reduction effect and a color reproducibility improvement effect of the display device in accordance with an embodiment. For the sake of explanation, the first sub-pixel area will be illustrated and described, and the same description will also be applied to the other sub-pixel areas.

Referring to FIG. 7, beams of incident light EXL1a and EXL2a which are incident on the display device may include first incident light EXL1a which is incident on the first emission area EA1, and second incident light EXL2a which is incident on the non-emission area NEA. For example, the first incident light EXL1a and the second incident light EXL2a each may be external light, e.g., natural light, which is incident from the outside, and may also be white light including light of all wavelength bands.

The first incident light EXL1a may be incident on the first emission area EA1 and be reflected by the first light emitting element LD1 disposed in the first emission area EA1 or by various lines electrically connected to the first light emitting element LD1. In other words, the first incident light EXL1a may be reflected by various components disposed in the first emission area EA1 and output to the outside as first reflective light EXL1b.

A path along which the first incident light EXL1a is output to the outside as the first reflective light EXL1b may be formed in the first color filter pattern CPR1. As described above, the first color filter pattern CPR1 may allow a specific color of light to selectively pass therethrough, and partially absorb the other colors of light. For example, the first color filter pattern CPR1 may allow red light to pass therethrough and partially absorb light other than red light.

In case that the first incident light EXL1a is white light including light of all wavelength bands, the first color filter pattern CPR1 may partially absorb light other than red light among various colors of light that form the white light. In other words, the quantity of the first reflective light EXL1b may be reduced compared to the quantity of the first incident light EXL1a.

The second incident light EXL2a may be incident on the non-emission area NEA, and at least a portion thereof may be reflected by the bank layer BNK disposed in the non-emission area NEA. The reflected second incident light EXL2a may be output to the outside as the second reflective light EXL2b.

A path along which the second incident light EXL2a is output to the outside as the second reflective light EXL2b may be formed in the first color filter pattern CPR1 and the second color filter pattern CPR2. As described above, the first color filter pattern CPR1 and the second color filter pattern CPR2 may allow a specific color of light to selectively pass therethrough, and partially absorb the other colors of light. For example, the first color filter pattern CPR1 may allow red light to pass therethrough, and the second color filter pattern CPR2 may allow green light to pass therethrough and partially absorb the other colors of light.

In case that the second incident light EXL2a is white light including light of all wavelength bands, the first color filter pattern CPR1 may partially absorb light other than red light among various colors of light that form the white light. Furthermore, the second color filter pattern CPR2 may partially absorb light other than green light among various colors of light that form the white light. In other words, the quantity of the second reflective light EXL2b may be reduced compared to the quantity of the second incident light EXL2a. Unlike the first emission area EA1, the non-emission area NEA further includes the second color filter pattern CPR2 and thus is able to absorb more various colors of light.

As described above, the first color filter pattern CPR1 disposed in the first emission area EA1 and the non-emission area NEA may absorb at least portions of the beams of first and second incident light EXL1a and ELX2a that are incident from the outside, and thus reduce the quantity of the beams of first and second reflective light EXL1b and EXL2b that are output to the outside. In other words, the first color filter pattern CPR1 may reduce the external light reflectivity of the display device, and thus display a clear image and improve image quality characteristics of the display device.

The second color filter pattern CPR2 that overlaps the first color filter pattern CPR1 and is disposed in the non-emission area NEA may absorb at least a portion of the second incident light EXL2a that is incident from the outside, and may further reduce the quantity of second reflective light EXL2b that is output to the outside. In other words, an effect of reducing the external light reflectivity of the display device may be improved.

Emitting light LO emitted from the first light emitting element LD1 may be output to the outside via the first color filter pattern CPR1. The first light emitting element LD1 may be a red light emitting element configured to emit red light. The emitting light LO may be red light.

Due to characteristics of light emitting elements, the wavelength of the emitting light LO emitted from the first light emitting element LD1 may vary depending on a grayscale displayed by the display device. For example, the wavelength of the emitting light LO that is emitted from the first light emitting element LD1 at a low grayscale may be at least partially different from the wavelength of the emitting light LO that is emitted from the first light emitting element LD1 at a high grayscale.

The first color filter pattern CPR1 may be disposed on the first light emitting element LD1, and may allow light of a specific wavelength band to transmit therethrough and absorb light of the other wavelength bands. In other words, even in case that the wavelength (or the color) of the emitting light LO emitted from the first light emitting element LD1 varies depending on the grayscale, the wavelength (or the color) of output light that is output to the outside may be adjusted to be uniform, so that color reproducibility may be enhanced.

In accordance with the foregoing embodiment, the color filter CFL is directly formed on a surface of the substrate SUB on which the light emitting elements LD are disposed, so that a clear color can be displayed, and reflection attributable to external light may be reduced.

Hereinafter, embodiments of the display device will be described. In the following embodiments, like reference numerals are used to designate the same components as those of the above-mentioned embodiments, descriptions thereof will be omitted or simplified, and the differences therebetween will be mainly described.

Figure 8:
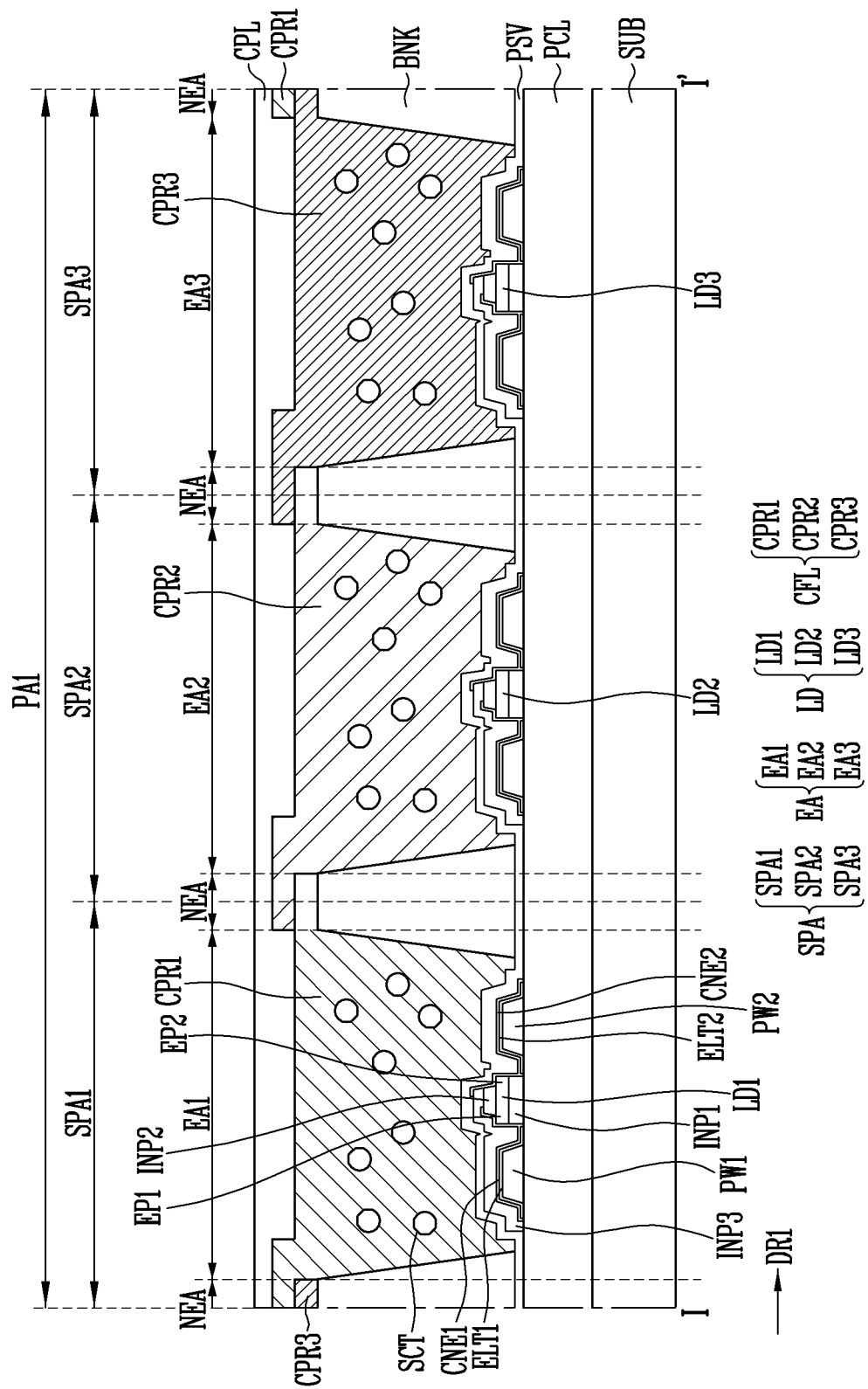
FIG. 8 is a cross-sectional view of a display device in accordance with an embodiment.
Figure 9:
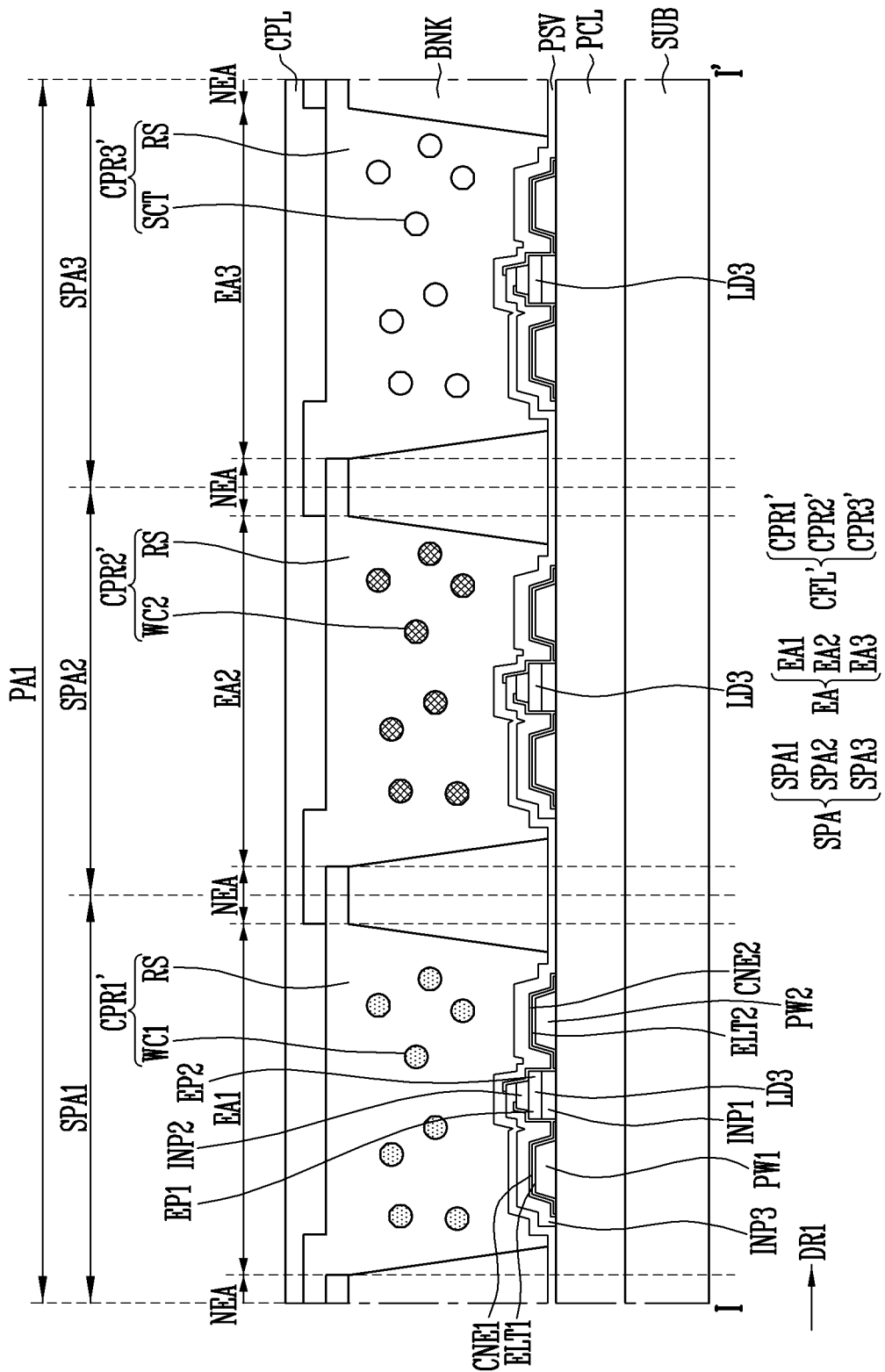
FIG. 9 is a cross-sectional view of a display device in accordance with an embodiment.

FIG. 8 is a schematic cross-sectional view of a display device in accordance with an embodiment. FIG. 9 is a schematic cross-sectional view of a display device in accordance with an embodiment. In detail, the embodiment of FIG. 8 differs from that of FIG. 5 at least in that the color filter CFL further includes scattering particles SCT. The embodiment of FIG. 9 differs from that of FIG. 5 at least in that a light modulation pattern CFL' rather than the color filter CFL is disposed.

Referring to FIG. 8, at least one of the first to third color filter patterns CPR1 to CPR3 may include scattering particles SCT. For example, each of the first to third color filter patterns CPR1 to CPR3 may include scattering particles SCT dispersed therein. The scattering particles SCT may include, e.g., at least one of titanium oxide ($TiO_2$), zirconium oxide ($ZrO_2$), aluminium oxide ($Al_2O_3$), indium oxide ($In_2O_3$), zinc oxide (ZnO), tin oxide ($SnO_2$), and silica. The material of the scattering particles SCT is not particularly limited, and may be made of various materials.

Light emitted from the light emitting elements LD may emitted in all directions by the scattering particles SCT in the color filter CF. Consequently, the viewing angle of the display device may be enhanced.

Referring to FIG. 9, the third light emitting elements LD3 may be disposed on the pixel circuit layer PCL. The third light emitting elements LD3 each may be a blue light emitting element configured to emit blue light.

A light modulation pattern CFL' may be disposed on the light emitting elements LD. The light modulation pattern CFL' may include a first wavelength conversion pattern CPR1' disposed in the first sub-pixel area SPA1, a second wavelength conversion pattern CPR2' disposed in the second sub-pixel area SPA2, and a light transmission pattern CPR3' disposed in the third sub-pixel area SPA3.

The first wavelength conversion pattern CPR1' may include a resin layer RS and first wavelength conversion particles WC1 dispersed in the resin layer RS. For example, the first wavelength conversion particles WC1 may convert blue light emitted from the third light emitting elements LD3 disposed in the first sub-pixel area SPA1 to red light.

The second wavelength conversion pattern CPR2' may include a resin layer RS and second wavelength conversion particles WC2 dispersed in the resin layer RS. For example, the second wavelength conversion particles WC2 may convert blue light emitted from the third light emitting elements LD3 disposed in the second sub-pixel area SPA2 to green light.

The first wavelength conversion particles WC1 and the second wavelength conversion particles WC2 may be fluorescent particles including quantum dots. In an embodiment, in case that the first wavelength conversion particles WC1 and the second wavelength conversion particles WC2 include quantum dots, each of the first and second wavelength conversion particles WC1 and WC2 may be selected from among a group II-IV compound, a group IV-VI compound, a group IV element, a group IV compound, and a combination thereof.

The first and second wavelength conversion particles WC1 and WC2 may have a full width at half maximum (FWHM) of an emission wavelength spectrum of about 45 nm or less, and light emitted through the first and second wavelength conversion particles WC1 and WC2 may be emitted in all directions. Consequently, the viewing angle of the light emitting display device may be enhanced.

The light transmission pattern CPR3' may include a resin layer RS and scattering particles SCT dispersed in the resin layer RS. The scattering particles SCT may scatter blue light emitted from the third light emitting elements LD3 disposed in the third sub-pixel area SPA3. Blue light scattered by the scattering particles SCT may be output to the outside. The scattering particles SCT may be substantially identical or similar to the scattering particles SCT described with reference to FIG. 8, and detailed descriptions thereof will thus be omitted.

The first wavelength conversion pattern CPR1', the second wavelength conversion pattern CPR2', and the light transmission pattern CPR3' of the light modulation pattern CFL' may overlap each other on the bank layer BNK disposed in the boundaries of the respective sub-pixel areas SPA.

At least a portion of external light that is incident on the non-emission area NEA may be reflected by the bank layer BNK, and at least a portion thereof may be absorbed by light modulation patterns CFL' disposed on the bank layer BNK. In other words, the external light reflectivity of the display device may be reduced.

Figure 10:
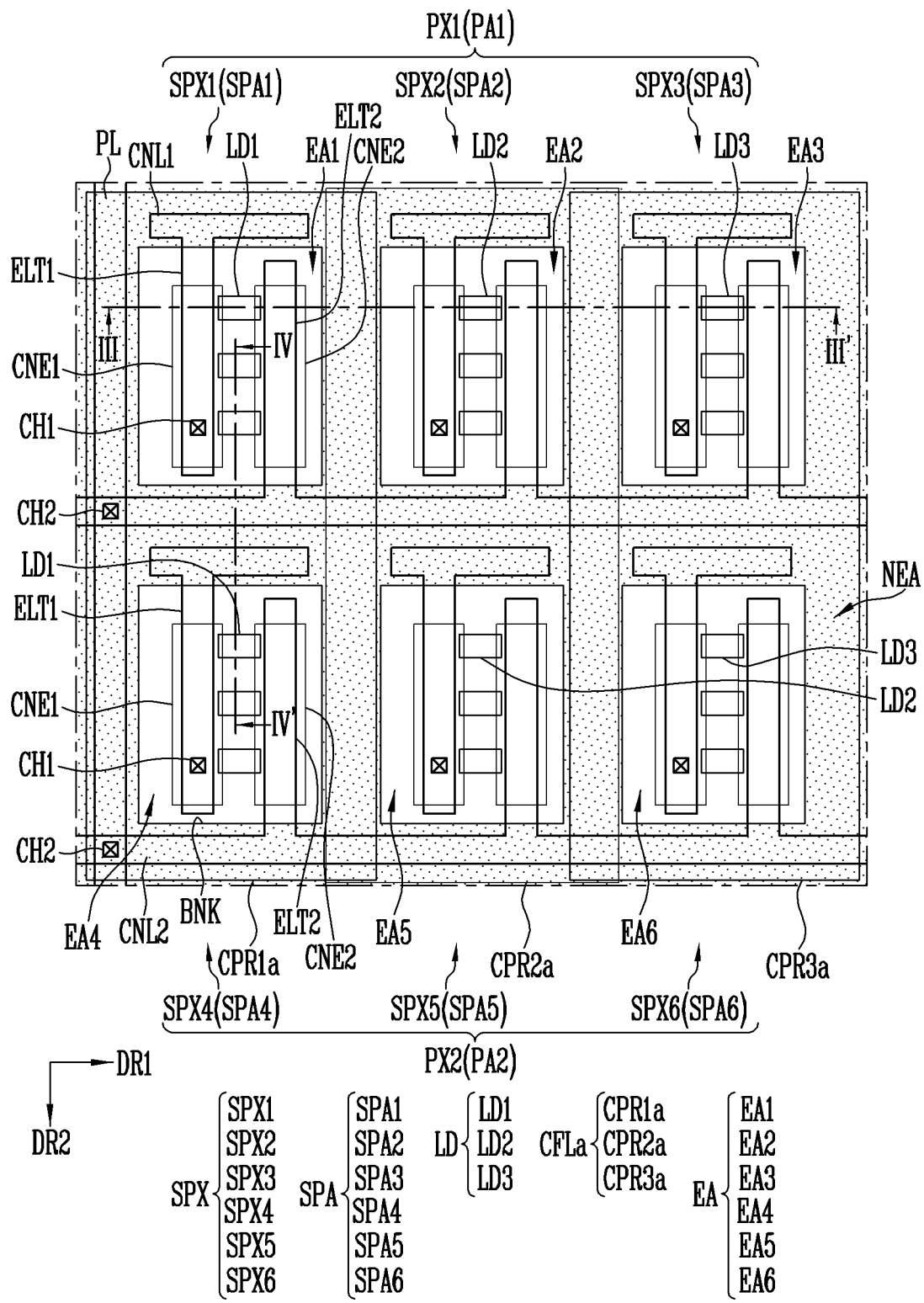
FIG. 10 is a plan view of a display device in accordance with an embodiment.
Figure 11:
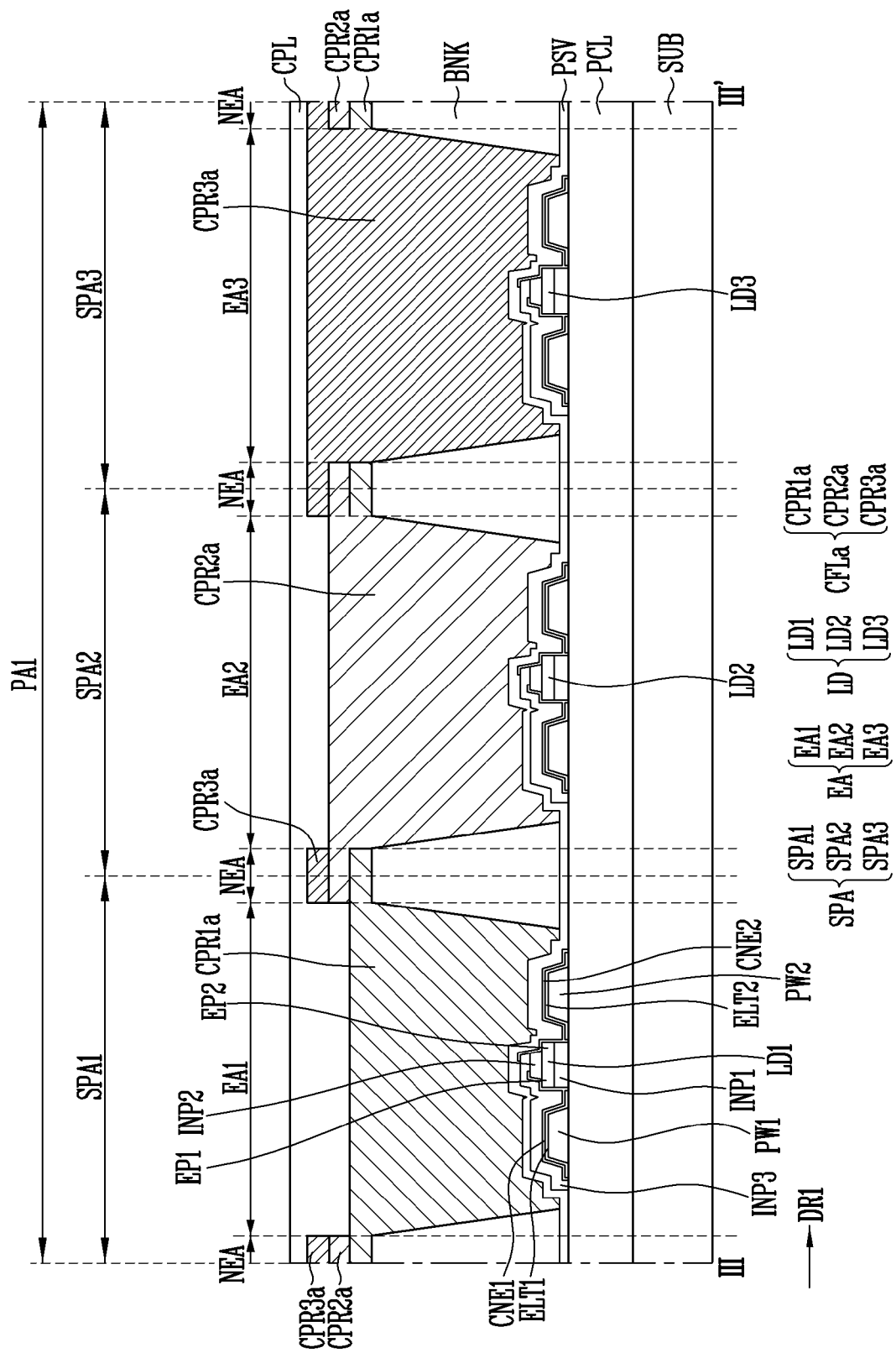
FIG. 11 is a cross-sectional view schematically illustrating a pixel, taken along line III-III' of FIG. 10.
Figure 12:
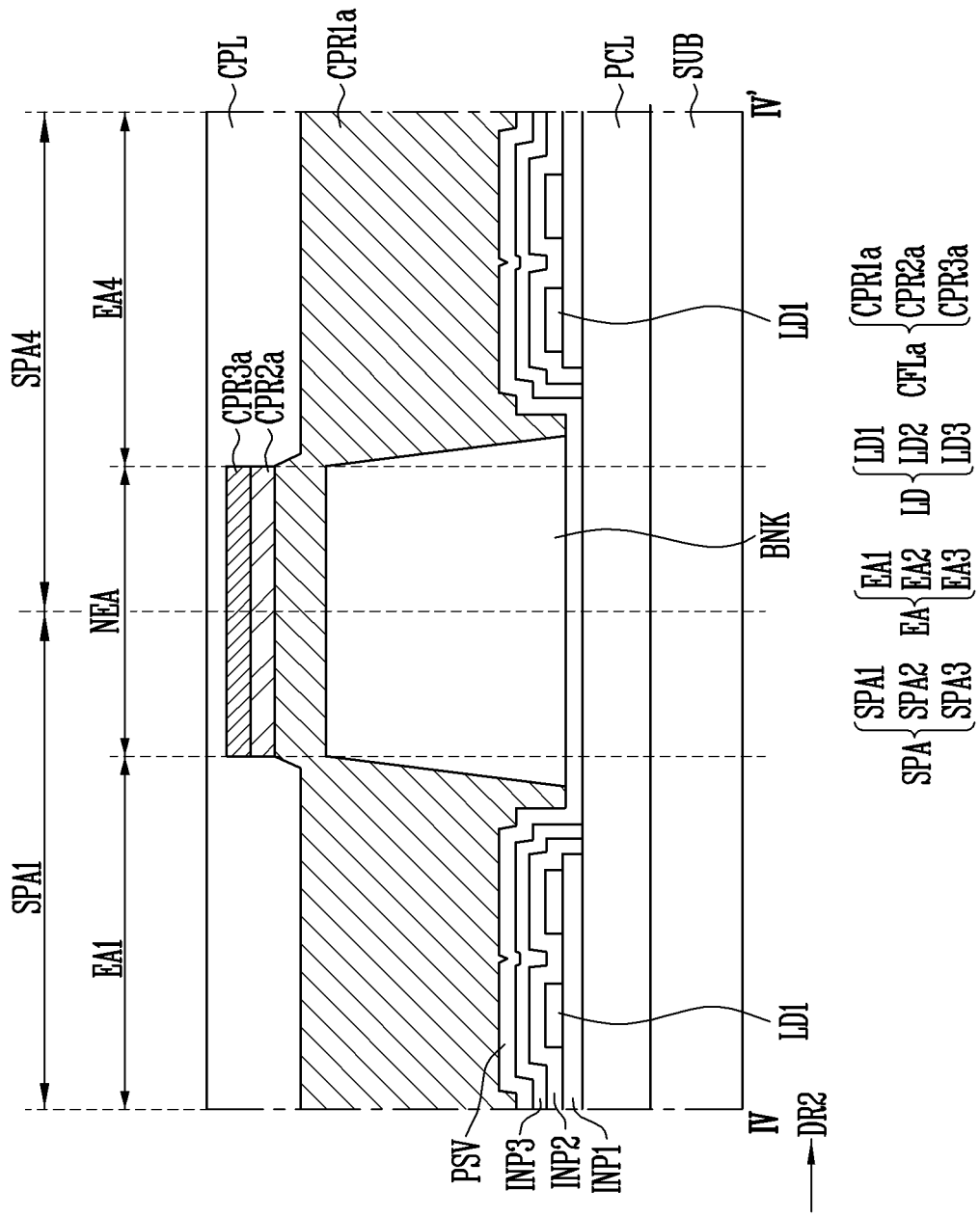
FIG. 12 is a cross-sectional view schematically illustrating a pixel, taken along line IV-IV' of FIG. 10.

FIG. 10 is a schematic plan view of a display device in accordance with an embodiment. FIG. 11 is a schematic cross-sectional view illustrating a pixel, taken along line III-III' of FIG. 10. FIG. 12 is a schematic cross-sectional view illustrating a pixel, taken along line IV-IV' of FIG. 10.

Unlike the embodiment of FIGS. 4A, 5, and 6, the embodiment of FIGS. 10 to 12 differs therefrom at least in that first to third color filter patterns CPR1*a*, CPR2*a*, and CPR3*a* overlap each other in the non-emission area NEA.

Referring to FIGS. 10 to 12, a color filter CFLa may be disposed in each of the sub-pixel areas SPA. The color filter CFLa may include a first color filter pattern CPR1*a* disposed in the first sub-pixel area SPA1, the fourth sub-pixel area SPA4, and the non-emission area NEA, a second color filter pattern CPR2*a* disposed in the second sub-pixel area SPA2, the fifth sub-pixel area SPA5, and the non-emission area NEA, and a third color filter pattern CPR3*a* disposed in the third sub-pixel area SPA3, the sixth sub-pixel area SPA6, and the non-emission area NEA.

In other words, the first to third color filter patterns CPR1*a* to CPR3*a* may overlap each other in the non-emission area NEA.

For example, as illustrated in FIG. 11, the first color filter pattern CPR1*a*, the second color filter pattern CPR2*a*, and the third color filter pattern CPR3*a* may be disposed in the non-emission area NEA between the first sub-pixel area SPA1 and the second sub-pixel area SPA2. The first color filter pattern CPR1*a*, the second color filter pattern CPR2*a*, and the third color filter pattern CPR3*a* may be disposed in the non-emission area NEA between the second sub-pixel area SPA2 and the third sub-pixel area SPA3.

Furthermore, as illustrated in FIG. 12, the first color filter pattern CPR1*a*, the second color filter pattern CPR2*a*, and the third color filter pattern CPR3*a* may also be disposed in the non-emission area NEA between the first sub-pixel area SPA1 and the fourth sub-pixel area SPA4.

Unlike the embodiment of FIGS. 4A to 6, in the embodiment of FIGS. 10 to 12, the first to third color filter patterns CPR1*a* to CPR3*a* are disposed in the non-emission area NEA, so that external light can be more effectively absorbed, and reflective light may be reduced, compared to the case where two of the first to third color filter patterns CPR1 to CPR3 overlap each other.

Figure 13:
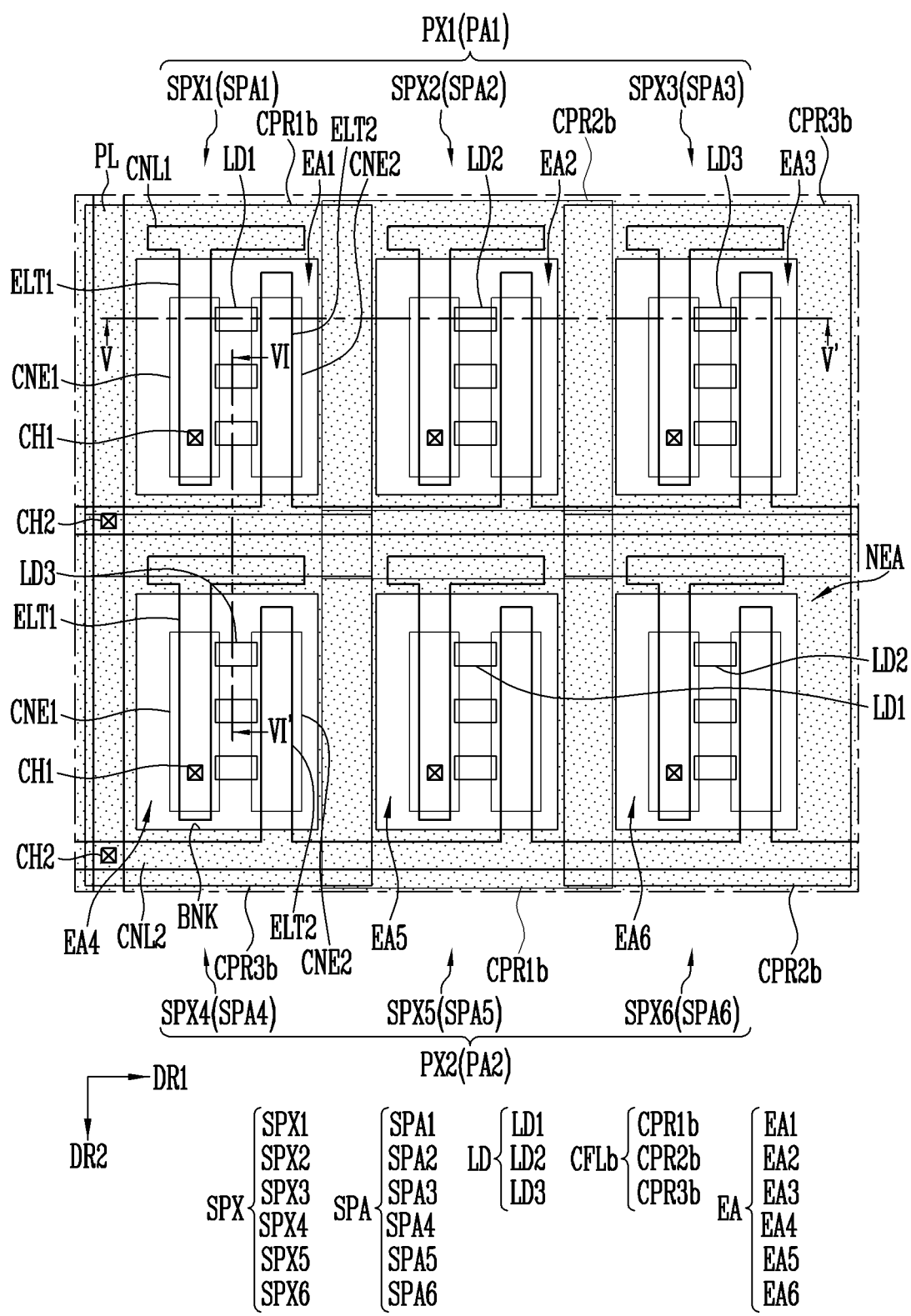
FIG. 13 is a plan view of a display device in accordance with an embodiment.
Figure 14:
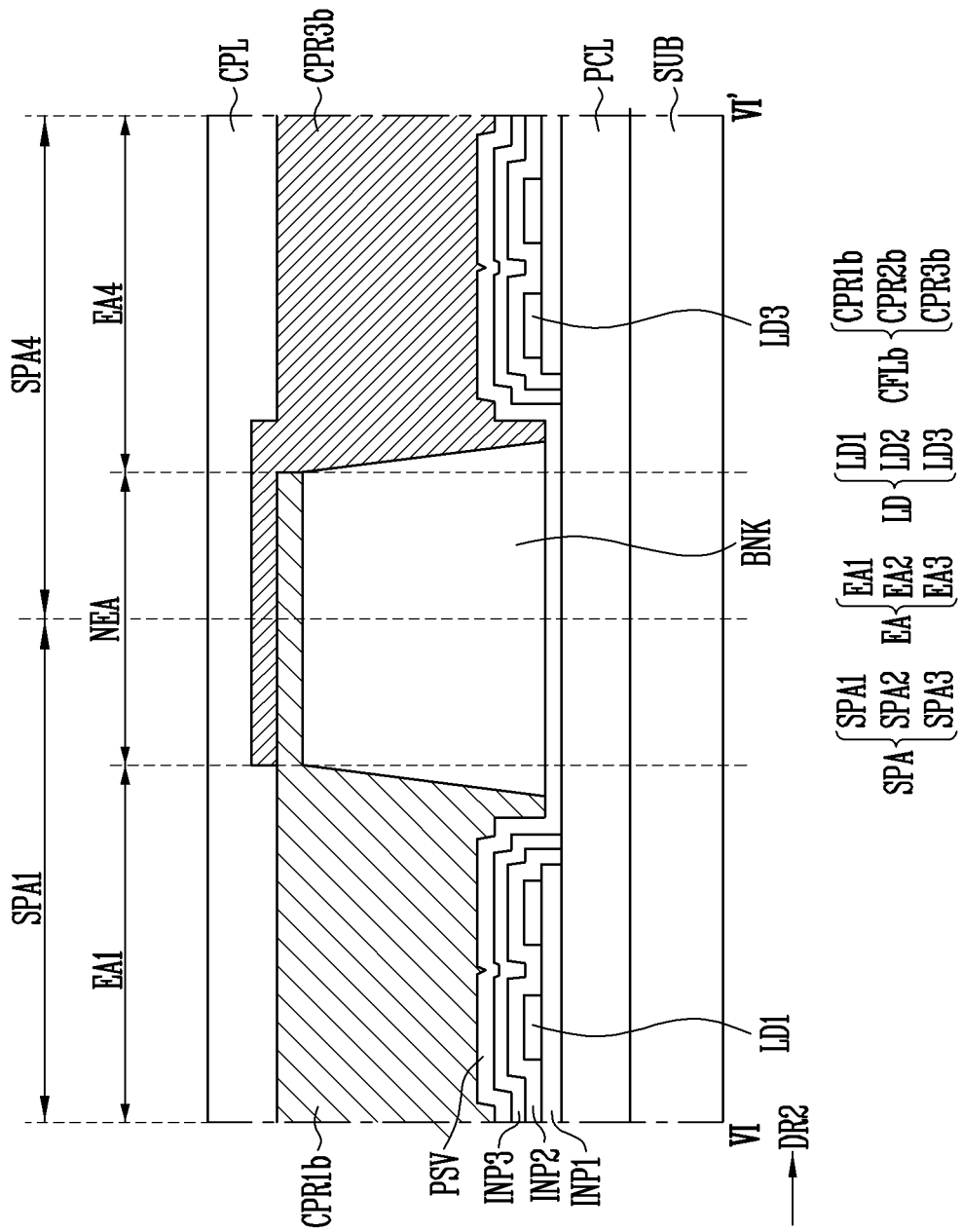
FIG. 14 is a cross-sectional view schematically illustrating a pixel, taken along line VI-VI' of FIG. 13.

FIG. 13 is a schematic plan view of a display device in accordance with an embodiment. FIG. 14 is a schematic cross-sectional view illustrating a pixel, taken along line VI-VI' of FIG. 13.

Unlike the embodiments of FIGS. 4A to 6, the embodiments of FIGS. 13 and 14 include a mosaic type pixel arrangement structure.

The schematic cross-sectional view taken along line V-V' of FIG. 13 may be substantially identical with the schematic cross-sectional view of FIG. 5, and detailed descriptions thereof will be omitted, and the following description will be focused on FIG. 14 that illustrates the schematic cross-sectional view taken along line VI-VI' of FIG. 13.

Referring to FIGS. 13 and 14, light emitting elements LD may be disposed in each of the sub-pixel areas SPA. Different light emitting elements may be disposed in the first to third sub-pixel areas SPA1 to SPA3 of the first pixel area PA1. For example, in the first pixel area PA1, the first light emitting element LD1 may be disposed in the first sub-pixel area SPA1, the second light emitting element LD2 may be disposed in the second sub-pixel area SPA2, and the third light emitting element LD3 may be disposed in the third sub-pixel area SPA3.

The same light emitting elements LD1, LD2, and LD3 as those of the first pixel area PA1 may be disposed in the fourth to sixth sub-pixel areas SPA4 to SPA6 of the second pixel area PA2. Unlike the above-mentioned embodiment, the disposition order of the light emitting elements LD in the second pixel area PA2 may differ from that of the first pixel area PA1.

For example, the third light emitting element LD3 may be disposed in the fourth sub-pixel area SPA4, the first light emitting element LD1 may be disposed in the fifth sub-pixel area SPA5, and the second light emitting element LD2 may be disposed in the sixth sub-pixel area SPA6.

A color filter CFLb may be disposed in each of the sub-pixel areas SPA. In the embodiment, the color filter CFLb may be individually disposed in each sub-pixel area SPA rather than being disposed extending in the second direction DR2.

For example, the color filter CFLb may include a first color filter pattern CPR1*b* disposed in the first sub-pixel area SPA1 and the fifth sub-pixel area SPA5, a second color filter pattern CPR2*b* disposed in the second sub-pixel area SPA2 and the sixth sub-pixel area SPA6, and a third color filter pattern CPR3*b* disposed in the third sub-pixel area SPA3 and the fourth sub-pixel area SPA4.

As illustrated in FIG. 14, different color filter patterns CPR1*b* and CPR3*b* may be disposed in the first sub-pixel area SPA1 and the fourth sub-pixel area SPA4 which are arranged in the second direction DR2. The first color filter pattern CPR1*b* may be disposed in the first sub-pixel area SPA1 and the non-emission area NEA between the first sub-pixel area SPA1 and the fourth sub-pixel area SPA4. The third color filter pattern CPR3*b* may be disposed in the fourth sub-pixel area SPA4 and the non-emission area NEA between the first sub-pixel area SPA1 and the fourth sub-pixel area SPA4. For example, the first color filter pattern CPR1*b* and the third color filter pattern CPR3*b* may overlap each other in the non-emission area NEA between the first sub-pixel area SPA1 and the fourth sub-pixel area SPA4. In other words, both the first color filter pattern CPR1*b* and the third color filter pattern CPR3*b* may be disposed on the bank layer BNK disposed between the first light emitting elements LD1 and the third light emitting elements LD3.

The display device in accordance with the embodiment includes a portion in which the first to third color filter patterns CPR1*b* to CPR3*b* overlap each other, in even the non-emission area NEA between the first pixel area PA1 and the second pixel area PA2 arranged in the second direction DR2. Therefore, the reflectivity of external light may be more effectively reduced compared to that of the display device in accordance with the embodiments of FIGS. 4A to 6.

Although the embodiments of the disclosure have been disclosed, those skilled in the art will appreciate that the disclosure can be implemented as other concrete forms, without departing from the scope and spirit of the disclosure. Therefore, it should be understood that the embodiments are only for illustrative purpose and do not limit the bounds of the disclosure.

What is claimed is:

1. A display device comprising:
   a substrate;
   a first sub-pixel including a first light emitting element disposed on and directly above a main surface of the substrate and in a first sub-pixel area of the substrate;
   a second sub-pixel including a second light emitting element disposed in a second sub-pixel area located in a first direction with respect to the first sub-pixel area of the substrate;
   a bank layer disposed between the first sub-pixel and the second sub-pixel;
   a first color filter pattern disposed on the first sub-pixel and the bank layer; and
   a second color filter pattern disposed on the second sub-pixel and the bank layer, wherein the first light emitting element emits light having a first color, the second light emitting element emits light having a second color different from the first color, the first color filter pattern and the second color filter pattern at least partially overlap each other on the bank layer, and each of the first light emitting element and the second light emitting element includes a first semiconductor layer and a second semiconductor layer, both of the first and second semiconductor layers intersecting a plane parallel to a plane defined by the main surface of the substrate.

2. The display device according to claim 1, further comprising a third sub-pixel including a third light emitting element disposed in a third sub-pixel area adjacent to the second sub-pixel area, the bank layer disposed between the second sub-pixel and the third sub-pixel, and a third color filter pattern disposed on the third sub-pixel and the bank layer, wherein the third light emitting element emits light having a third color different from the first color and the second color, the third color filter pattern is a color filter different from the first color filter pattern and the second color filter pattern, and the second color filter pattern and the third color filter pattern at least partially overlap each other on the bank layer.

3. The display device according to claim 2, wherein the third color filter pattern is further disposed on the bank layer disposed between the first sub-pixel and the second sub-pixel.

4. The display device according to claim 3, wherein the first color filter pattern is further disposed on the bank layer disposed between the second sub-pixel and the third sub-pixel.

5. The display device according to claim 4, wherein the second color filter pattern is further disposed on the bank layer disposed between the third sub-pixel and the first sub-pixel.

6. The display device according to claim 2, wherein in a plan view, a fourth sub-pixel area is located in a second direction perpendicular to the first direction with respect to the first sub-pixel area, the display device further comprises:
a fourth sub-pixel including a fourth light emitting element disposed in the fourth sub-pixel area;
the bank layer disposed between the first sub-pixel and the fourth sub-pixel; and
a fourth color filter pattern disposed on the fourth sub-pixel and the bank layer, the fourth light emitting element emits light having one of the first color, the second color, and the third color, and the fourth color filter pattern is a color filter substantially identical to one of the first color filter pattern, the second color filter pattern, and the third color filter pattern.

7. The display device according to claim 6, wherein the fourth light emitting element emits light having a color substantially identical to the first color of the first light emitting element, the fourth color filter pattern is a color filter substantially identical to the first color filter pattern, and the first color filter pattern and the fourth color filter pattern are provided as a single color filter and successively disposed in the first sub-pixel area and the fourth sub-pixel area.

8. The display device according to claim 7, wherein at least one of the second color filter pattern and the third color filter pattern is further disposed on the bank layer disposed between the first sub-pixel and the fourth sub-pixel.

9. The display device according to claim 6, wherein the fourth light emitting element emits light having a color substantially identical to one of the second color of the second light emitting element and the third color of the third light emitting element, and the fourth color filter pattern is a color filter substantially identical to one of the second color filter pattern and the third color filter pattern.

10. The display device according to claim 9, wherein the first color filter pattern, the second color filter pattern, and the third color filter pattern are disposed on the bank layer disposed between the first sub-pixel and the fourth sub-pixel.

11. The display device according to claim 2, wherein the first color filter pattern, the second color filter pattern, and the third color filter pattern further include scattering particles dispersed therein.

12. The display device according to claim 11, wherein the scattering particles include at least one of titanium oxide ($TiO_2$), zirconium oxide ($ZrO_2$), aluminium oxide ($Al_2O_3$), indium oxide ($In_2O_3$), zinc oxide ($ZnO$), tin oxide ($SnO_2$), and silica.

13. The display device according to claim 2, wherein
the first color is red,
the second color is green, and
the third color is blue.

14. The display device according to claim 1, wherein a height of each of the first color filter pattern and the second color filter pattern is greater than a height of the bank layer.

15. The display device according to claim 1, further comprising a capping layer disposed to overlap the first color filter pattern and the second color filter pattern.

16. The display device according to claim 1, wherein
each of the first light emitting element and the second light emitting element is a light emitting diode having a size of a micrometer scale or a nanometer scale, and
each of the first light emitting element and the second light emitting element comprises:
a first semiconductor layer doped with a first conductive dopant;
a second semiconductor layer doped with a second conductive dopant; and
an active layer disposed between the first semiconductor layer and the second semiconductor layer.

17. The display device according to claim 16, wherein
the first semiconductor layer is disposed on a first end of each of the first light emitting element and the second light emitting element,
the second semiconductor layer is disposed on a second end of each of the first light emitting element and the second light emitting element, and
the first semiconductor layer comprises an n-type semiconductor layer,
the second semiconductor layer comprises a p-type semiconductor layer, and
a length of the first semiconductor layer is greater than a length of the second semiconductor layer.

18. The display device according to claim 17, further comprising:

a first electrode and a second electrode disposed on the substrate and spaced apart from each other in the first direction, wherein the first electrode is electrically connected to the first end, and the second electrode is electrically connected to the second end.

19. The display device according to claim 18, wherein a first bank formed adjacent to the first end of the first light emitting element and a second bank formed adjacent to the second end of the first light emitting element are included in the first sub-pixel area, and the first bank is disposed between the substrate and the first electrode, and the second bank is disposed between the substrate and the second electrode.

20. The display device according to claim 19, further comprising:

a passivation layer disposed on the substrate and overlapping the first light emitting element, the first electrode, and the second electrode, wherein the bank layer is disposed on the passivation layer.

21. The display device according to claim 1, wherein each of the light emitting elements is rod shaped having a length and width with the length being greater than the width, the first semiconductor layer and the second semiconductor layer of each light emitting element are spaced apart from one another along a direction of the length, the first and second semiconductor layers of each light emitting element intersect a respective line parallel to the main surface of the substrate, and the line intersects the bank, the first semiconductor layer, and the second semiconductor layer.

* * * * *